US012648441B2

(12) United States Patent
Ong et al.

(10) Patent No.: US 12,648,441 B2
(45) Date of Patent: Jun. 2, 2026

(54) THERMAL DISSIPATION IN POWER IC USING PYROELECTRIC MATERIALS

(71) Applicant: Taiwan Semiconductor Manufacturing Company, Ltd., Hsinchu (TW)

(72) Inventors: Yi Ching Ong, Hsinchu (TW); Kuo-Ching Huang, Hsinchu City (TW); Harry-Hak-Lay Chuang, Zhubei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 855 days.

(21) Appl. No.: 17/749,418

(22) Filed: May 20, 2022

(65) Prior Publication Data

US 2023/0268244 A1 Aug. 24, 2023

Related U.S. Application Data

(60) Provisional application No. 63/312,178, filed on Feb. 21, 2022.

(51) Int. Cl.
*H10W 40/25* (2026.01)
*H10W 70/02* (2026.01)
(Continued)

(52) U.S. Cl.
CPC ......... *H10W 40/255* (2026.01); *H10W 70/02* (2026.01); *H10W 70/05* (2026.01); *H10W 70/685* (2026.01)

(58) Field of Classification Search
CPC ............. H01L 23/3735; H01L 21/4857; H01L 21/4871; H01L 23/49822; H01L 2225/06524; H01L 2225/06541; H01L 2225/06589; H01L 25/18; H01L 23/481; H01L 23/522; H01L 25/0657; H01L 23/3731; H10W 40/255; H10W 70/02; H10W 70/05; H10W 70/685
See application file for complete search history.

(56) References Cited

U.S. PATENT DOCUMENTS

| | | | | |
|---|---|---|---|---|
| 9,640,531 B1 * | 5/2017 | Or-Bach | ............. | H01L 27/0694 |
| 10,939,537 B1 * | 3/2021 | Lebron | ................. | H10N 10/17 |

(Continued)

FOREIGN PATENT DOCUMENTS

| | | |
|---|---|---|
| TW | 200529398 A | 9/2005 |

*Primary Examiner* — Christine S. Kim
*Assistant Examiner* — Sesha Sairaman Srinivasan
(74) *Attorney, Agent, or Firm* — Eschweiler & Potashnik, LLC

(57) ABSTRACT

An electrocaloric heat dissipation device is formed by inserting metal layer-pyroelectric layer-metal layer (MPM) structures between the metallization layers in a metal interconnect. Electric fields are alternately applied and relaxed to induce temperatures of the pyroelectric layers to cycle and drive heat transfer. The heat dissipation device may be placed adjacent a hot spot in a power management integrated circuit (PMIC) and is particularly useful when the PMIC is in a 3D package. In some embodiments, the MPM structures are inserted around circuit wiring. Interconnects for the heat dissipation device may replace dummy metal wiring.

20 Claims, 17 Drawing Sheets

(51) Int. Cl.
*H10W 70/05* (2026.01)
*H10W 70/685* (2026.01)

(56) References Cited

U.S. PATENT DOCUMENTS

| | | | | | |
|---|---|---|---|---|---|
| 2003/0176004 | A1* | 9/2003 | Willing | H10N 15/10 | |
| | | | | 438/54 | |
| 2003/0188538 | A1 | 10/2003 | Chu et al. | | |
| 2005/0178423 | A1* | 8/2005 | Ramanathan | H01L 23/38 | |
| | | | | 136/201 | |
| 2007/0093051 | A1* | 4/2007 | Miyoshi | H10N 30/871 | |
| | | | | 438/622 | |
| 2011/0000060 | A1* | 1/2011 | Lee | H10N 39/00 | |
| | | | | 29/25.35 | |
| 2013/0067935 | A1* | 3/2013 | Kruglick | F25B 21/00 | |
| | | | | 62/3.2 | |
| 2016/0084702 | A1* | 3/2016 | Tomioka | G01J 5/0853 | |
| | | | | 250/338.3 | |
| 2017/0054066 | A1* | 2/2017 | Cann | H01L 23/373 | |
| 2018/0123017 | A1* | 5/2018 | Fujii | H10N 30/8554 | |
| 2018/0277530 | A1* | 9/2018 | Or-Bach | H01L 21/304 | |
| 2019/0226727 | A1* | 7/2019 | Eastman | C09K 5/14 | |
| 2021/0140686 | A1* | 5/2021 | Mantese | F25B 21/00 | |
| 2021/0164705 | A1* | 6/2021 | Eastman | F25B 21/00 | |
| 2021/0202312 | A1* | 7/2021 | Yu | H01L 21/76898 | |

* cited by examiner

600

119F

653

651
641
633
632
623
622
621
631

$M_{n+1}$

115F $M_n$ 411
412
413
414
415

$M_{n-1}$

621

700

621

MPM

MPM

115F

800

621

MPM

115F

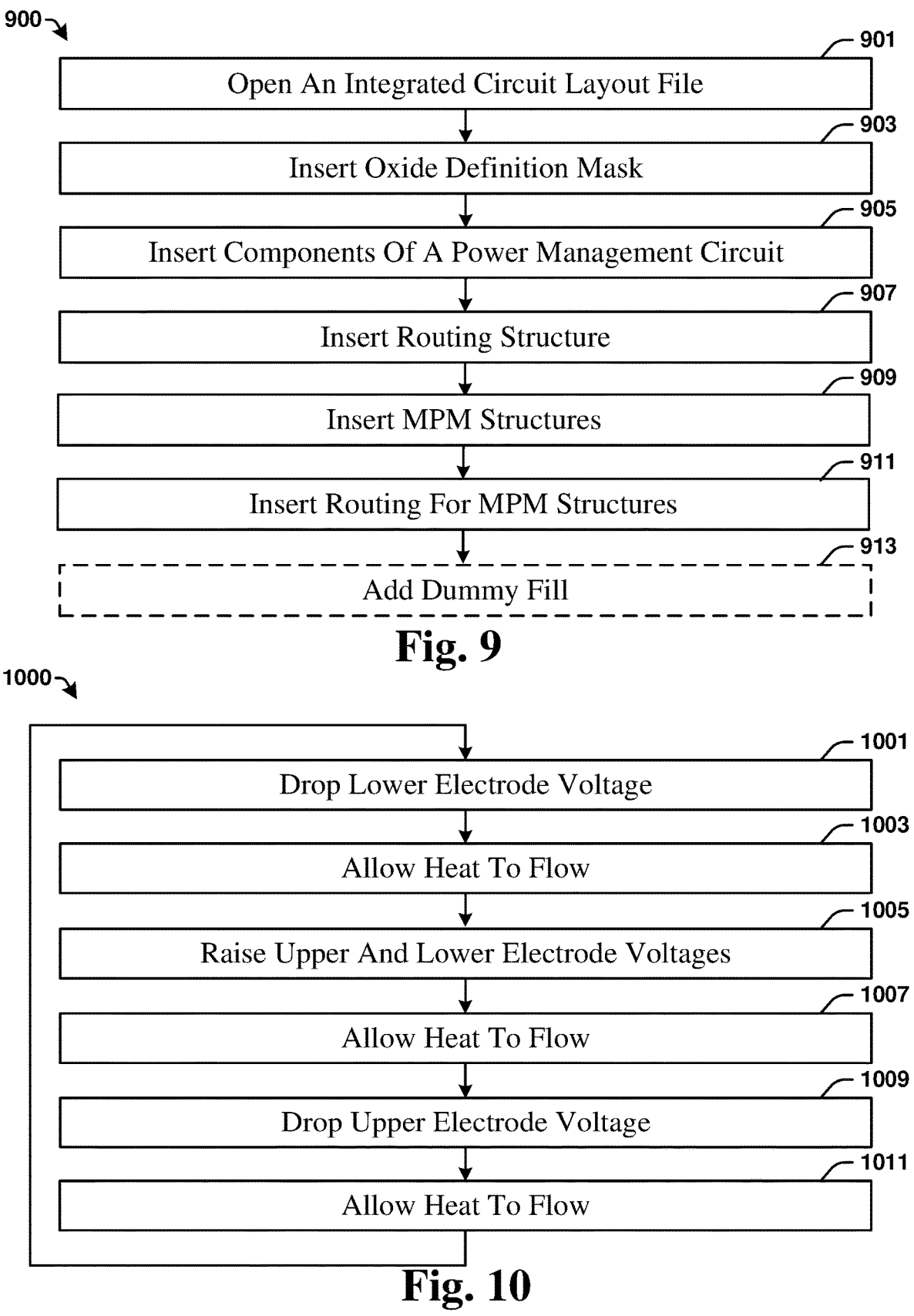

900

901 Open An Integrated Circuit Layout File

903 Insert Oxide Definition Mask

905 Insert Components Of A Power Management Circuit

907 Insert Routing Structure

909 Insert MPM Structures

911 Insert Routing For MPM Structures

913 Add Dummy Fill

1001 Drop Lower Electrode Voltage

1003 Allow Heat To Flow

1005 Raise Upper And Lower Electrode Voltages

1007 Allow Heat To Flow

1009 Drop Upper Electrode Voltage

1011 Allow Heat To Flow

THERMAL DISSIPATION IN POWER IC USING PYROELECTRIC MATERIALS

REFERENCE TO RELATED APPLICATION

This application claims the benefit of U.S. Provisional Application No. 63/312,178 filed on Feb. 21, 2022, the contents of which are incorporated herein by reference in their entirety.

BACKGROUND

Many modern-day electronic devices contain power management integrated circuits (PMICs). Examples of PMIC include bipolar devices, complimentary metal-oxide-semiconductor (CMOS) devices, laterally diffused metal-oxide-semiconductor (LDMOS) devices, double-diffused metal-oxide-semiconductor (DMOS) devices, high electron mobility transistor (HEMT) devices, gallium nitride (GaN) devices, and the like. These PMICs may be integrated into 3D packages. 3D packages include integrated fan-out (InFO) packages, chip on wafer on substrate (CoWoS) packages, and wafer on wafer packages. Heat dissipation is an issue for all PMICs. The issue is exacerbated by 3D packaging and made more difficult to resolve as devices are made progressively more compact.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 is a flow chart of a computer-aided integrated circuit design method according to some aspects of the present disclosure.

FIG. 10 is a flow chart of a method of operating a heat dissipation device in accordance with some aspects of the present disclosure.

DETAILED DESCRIPTION

Figure 1:
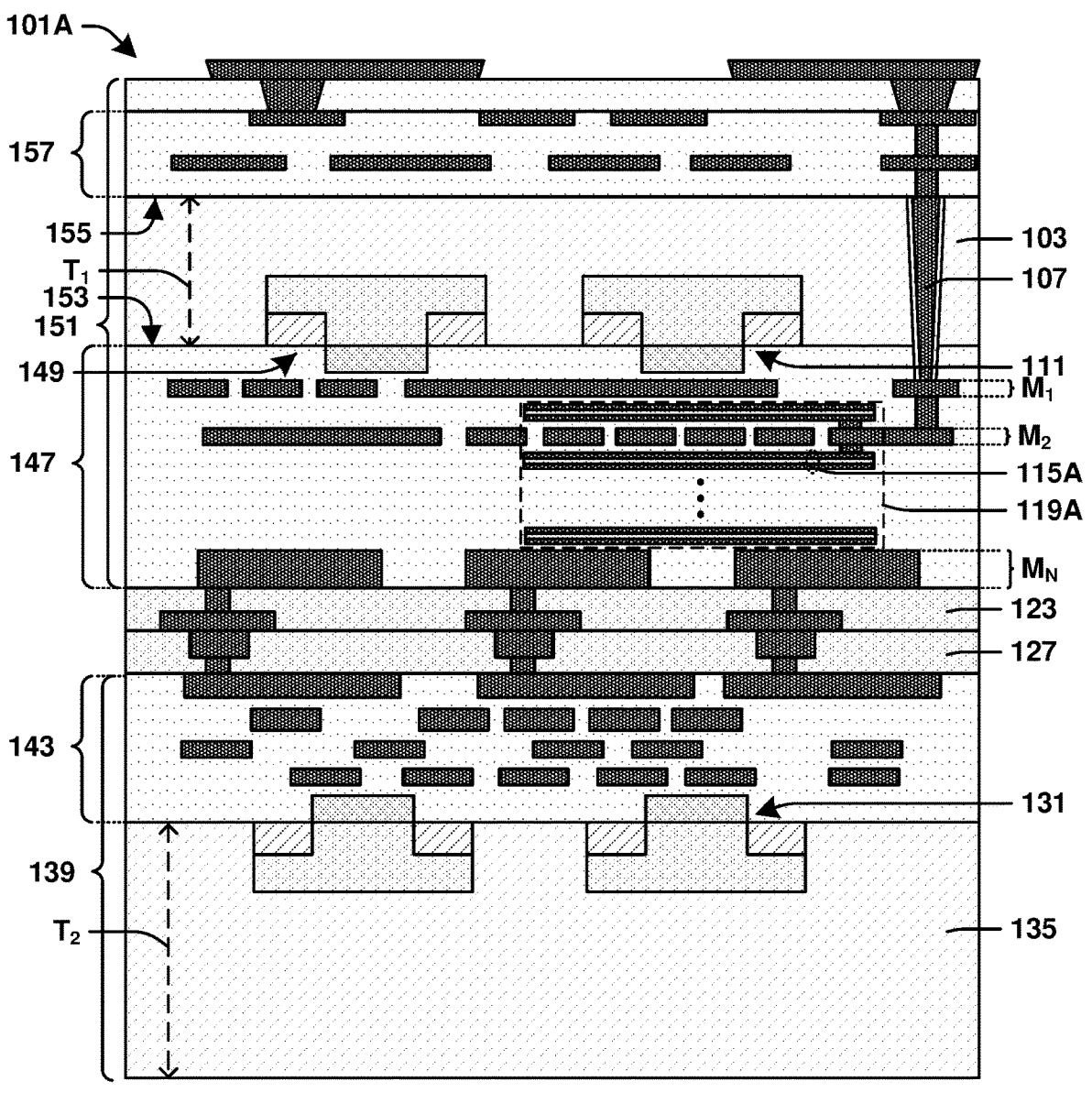
FIG. 1 illustrates a cross-sectional side view of an integrated circuit (IC) device according to some aspects of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides pyroelectric layers between electrodes in metal layer-pyroelectric layer-metal layer (MPM) structures disposed between metallization layers in a metal interconnect that is above or below a PMIC. Applying electric fields to the pyroelectric layers increases their temperatures through the electrocaloric effect. Removing the electric field reduces their temperatures. The metal layers provide electrodes that are used to cycle electric fields on the pyroelectric layers with a timing that results in increased heat dissipation from the PMIC.

In some embodiments the MPM structures contain additional pyroelectric-metal layers, e.g., the MPM structures may be MPMPM structures or MPMPMPM structures. In some embodiments, the MPM structures are between each pair of metallization layers in a metal interconnect. The collection of MPM structures facilitates heat transport from a source proximate a semiconductor substrate to a heat sink on a side of the metal interconnect distal form the semiconductor substrate. In some embodiments, the heat sink is a metal connection to ground, which may be thick. In some embodiments, the heat sink is a system-level heat sink such as metal fins. In some embodiments, the heat sink is a thermal redistribution layer. In some embodiments, the heat sink is a thermal interface material. In some embodiments, the heat sink is a thermal through-substrate-via (TTSV). The MPM structures preserve electrical isolation while enhancing heat dissipation.

The MPM structures inserted into the metal interconnect provide a heat dissipation device. In some embodiments, the metal layers of the MPM structures are coupled to wires in adjacent metallization layers by vias. In some embodiments, the metal layers are coupled to wires in adjacent metallization layers by arrays of vias. The vias can increase heat transport between metal layers of the MPM structures and adjacent metallization layers. In some embodiments, the MPM structures have thicknesses that are half or less a distance between the adjacent metallization layers. In some embodiments, the MPM structures have stepped edges that allow two or more metal layers to be coupled with wires in one of the adjacent metallization layers. The stepped edges are particularly useful when the MPM structures comprise three or more metal layers (e.g., an MPMPM structure). In some embodiments a middle layer in an MPMPM structure is coupled to ground.

In some embodiments, the MPM structures are inserted within or in place of dummy metal patterning within the metal interconnect. The dummy metal itself may provide good heat transport through metallization layers. In some embodiments, dummy metal structures are present between MPM structures. In some embodiments, the dummy metal is replaced by wires that couple to electrodes of the MPM structures. Dummy metal is inserted after routing connections that are coupled to structures on the semiconductor substrate.

Some aspects of the present disclosure relate to a computer-aided integrated circuit design process. The method includes generating an integrated circuit layout file comprising an oxide definition mask, inserting power management IC devices, and inserting a routing structure for the power management IC devices. MPM structures are then defined, wherein the MPM structures are inserted within areas left open by the routing structure. Routing connections for the MPM structures are then inserted. Dummy fill may subsequently be added.

As a consequence of this design strategy, the MPM structures may be provided in multiple or irregularly shaped pieces between and around routing connections that are coupled to structures on the semiconductor substrate. In some embodiments, a wire that is coupled to a device on the semiconductor substrate is disposed between two MPM structures. In some embodiments, two MPM structures between a pair of adjacent metallization layers are disposed on opposite sides of a via that is coupled to a device on the semiconductor substrate. In some embodiments, a single MPM structure is shaped such that portions of the MPM structure are disposed on each of two directly opposite sides of the via.

In some embodiments, the metal interconnect that contains the MPM structures is on the front side of a semiconductor substrate. This configuration places the heat dissipation device closest to the heat source. In some embodiments, an integrated chip comprising a second semiconductor substrate is attached to the front side to make a 3D structure. Enhanced heat dissipation is of particular value in this configuration.

In some embodiments, the metal interconnect that contains the MPM structures is on the back side of a semiconductor substrate. In some embodiments the semiconductor substrate has been thinned. In some of these embodiments, an integrated chip comprising a second semiconductor substrate is attached to the front side to make a 3D structure. In some embodiments, a TSV is formed through the semiconductor substrate. A semiconductor substrate is usually thinned prior to forming a TSV. MPM structures on the back side are more effective for dissipating heat from a PMIC on the front side if the semiconductor substrate has been thinned. In some embodiments, the metal interconnect on the back side is a redistribution layer. The redistribution layer may be part of an InFO package.

Some aspects of the present disclosure relate to a method of manufacturing an IC device with a heat dissipation device integrated into a metal interconnect. The method includes forming a first metallization layer, forming a first MPM structure over the first metallization layer, forming a second metallization layer over the first MPM structure, and forming a second MPM structure over the second metallization layer. The method may include forming MPM structures between each pair of metallization layers in the metal interconnect.

Some aspects of the present disclosure relate to a method of heat dissipation from an IC device. The method includes using the electrocaloric effect to increase the temperature of a first pyroelectric layer at a first level of a metal interconnect, using the electrocaloric effect to increase the temperature of a second pyroelectric layer at a second level of the metal interconnect, using the electrocaloric effect to decrease the temperature of the first pyroelectric layer, and using the electrocaloric effect to decrease the temperature of the second pyroelectric layer. One or more metallization layers may be disposed between the first pyroelectric layer and the second pyroelectric layer.

FIG. 1 provides a cross-sectional view illustration of an IC device 101A in accordance with some embodiments of the present disclosure. The IC device 101A includes a first chip 151 in a 3D package with a second chip 139. The IC device 101A comprises a PMIC including a first high voltage device 111 and a second high voltage device 149 on a first semiconductor substrate 103. The second chip 139 includes logic devices 131 on a second semiconductor substrate 135.

The first chip 151 further comprises a front-side metal interconnect 147 and a back-side metal interconnect 157. The front-side metal interconnect 147 is a back-end-of-line (BEOL) metal interconnect, includes metallization layer $M_1$, $M_2$, . . . , $M_N$, and is disposed on a front 153 of the first semiconductor substrate 103. The back-side metal interconnect 157 is disposed on a back 155 of the first semiconductor substrate 103 and may be a redistribution layer (RDL). A through substrate via (TSV) 107 provide a connection between the front-side metal interconnect 147 and the back-side metal interconnect 157.

The second chip 139 comprises a metal interconnect 143 over the logic devices 131. The first chip 151 and the second chip 139 are in a facing arrangement and are coupled through a bond layer 123 and a contact layer 127.

A heat dissipation device 119A is integrated into the front-side metal interconnect 147 directly below and facing a potential hot spot of the PMIC that includes the first high voltage device 111. The heat dissipation device 119A comprises MPM structures 115A between each adjacent pair of the metallization layers $M_1$, $M_2$, . . . , $M_N$. The heat dissipation device 119A is laterally offset from the second high voltage device 149. A hot spot of the PMIC may occur over the first high voltage device 111 but not extend to the second high voltage device 149. The heat dissipation device 119A may be more effective if localized over the first high voltage device 111.

Figure 2:
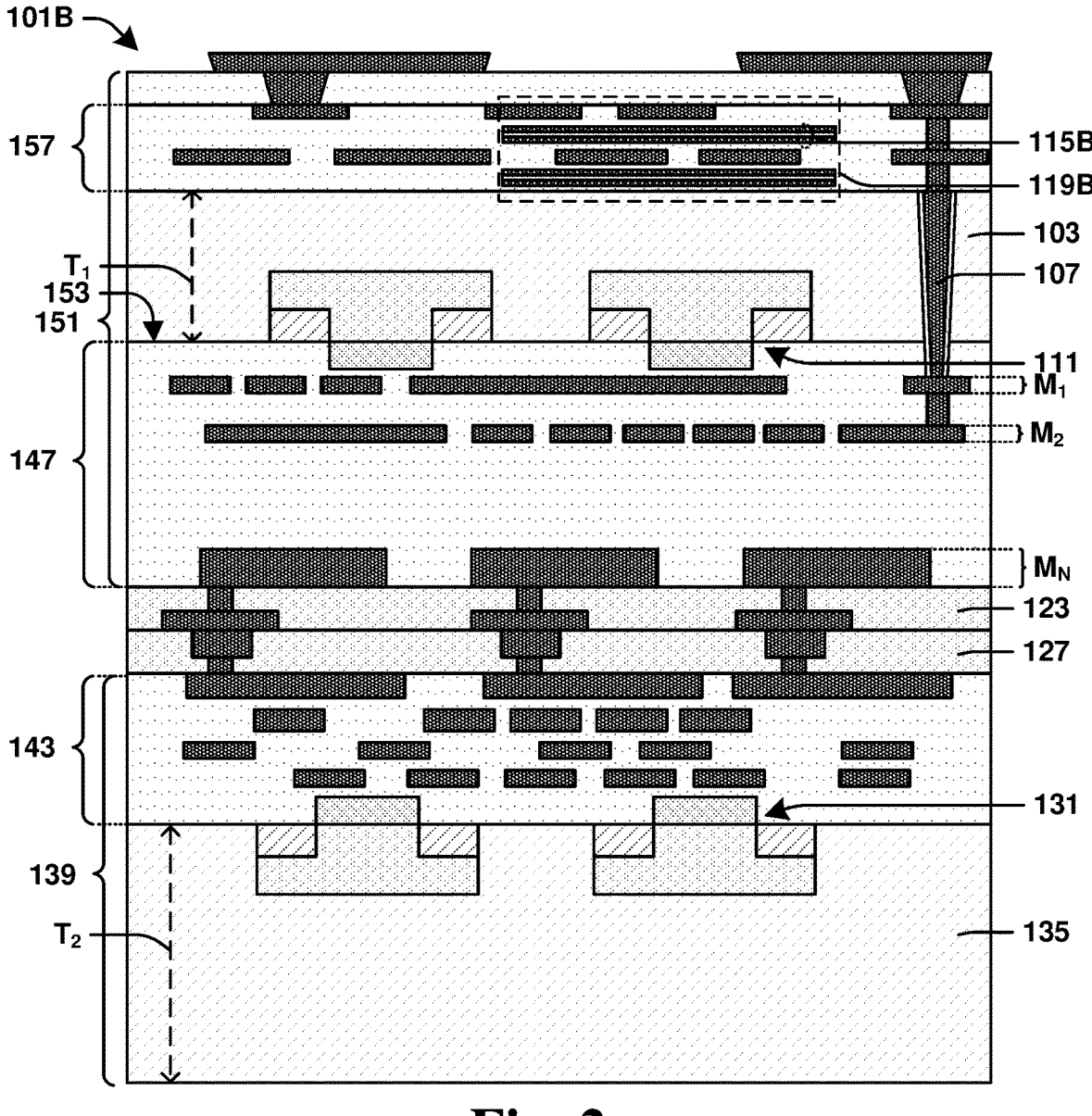
FIG. 2 illustrates a cross-sectional side view of an IC device according to some other aspects of the present disclosure.

FIG. 2 provides a cross-sectional view illustration of an IC device 101B in accordance with some other embodiments of the present disclosure. The IC device 101B is like the IC device 101A but instead of having the heat dissipation device 119A incorporated into the front-side metal interconnect 147, the IC device 101B has a heat dissipation device 119B integrated into the back-side metal interconnect 157 directly above and facing the potential hot spot of the PMIC. The heat dissipation device 119B has MPM structures 115B between adjacent pairs of the metallization layers in the back-side metal interconnect 157. The heat dissipation device 119B may also have an MPM structures 115B between the first semiconductor substrate 103 and the closest of the metallization layers in the back-side metal interconnect 157.

The first semiconductor substrate 103 is relatively thin, which allows the heat dissipation device 119B to be effective for cooling a PMIC on the front 153. In some embodiments, a thickness $T_1$ of the first semiconductor substrate 103 is in a range from about 1 μm to about 10 μm. In some embodiments, the thickness $T_1$ of the first semiconductor substrate 103 is in a range from about 2 μm to about 5 μm. Such narrow thicknesses result from wafer thinning. A thickness $T_2$ of the second semiconductor substrate 135 may be in a range from about 500 μm to about 1000 μm.

Figure 3:
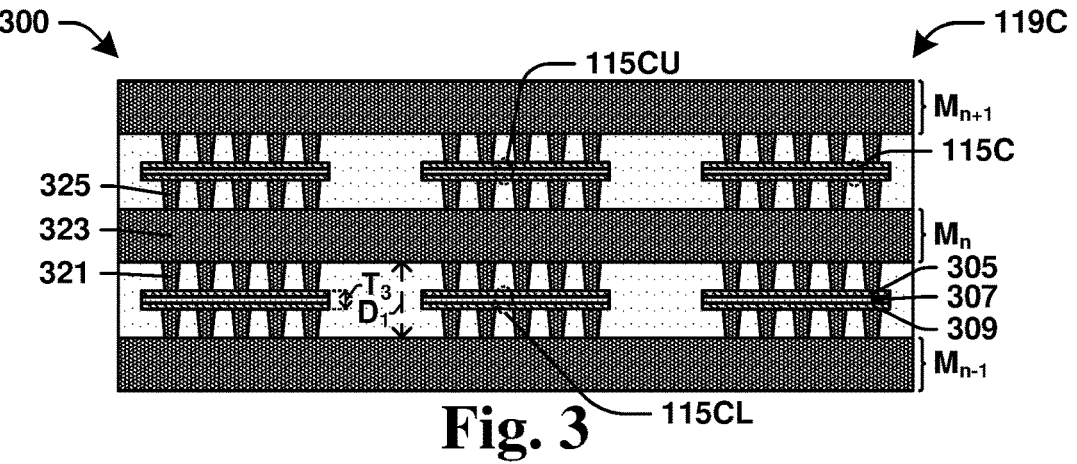
FIG. 3 illustrates a cross-sectional side view of a heat dissipation device according to some aspects of the present disclosure.

FIG. 3 provides a cross-sectional view 300 illustrating a heat dissipation device 119C in accordance with some other embodiments of the present disclosure. The heat dissipation device 119C may be used as the heat dissipation device 119A in the IC device 101A or as the heat dissipation device 119B in the IC device 101B. The heat dissipation device 119C includes MPM structures 115C between adjacent pairs of metallization layers $M_{n-1}$, $M_n$, and $M_{n+1}$.

The MPM structures 115C include a pyroelectric layer 307 between an upper metal layer 305 and a lower metal layer 309. In some embodiments, the upper metal layer 305 has the same composition as the lower metal layer 309. In some embodiments, the upper metal layer 305 has a different composition from the lower metal layer 309. Having distinct compositions may facilitate processing. Having the compositions be the same may provide more uniform electrical characteristics. The compositions may be selected from among metal and metal compounds that have high electrical and thermal conductivities. Examples of metals that may be suitable include tungsten (W), aluminum (Al), copper (Cu), titanium (Ti), tantalum (Ta), cobalt (Co), nickel (Ni), ruthenium (Ru), combinations thereof, and the like. Examples of metals compounds that may be suitable include titanium nitride (TiN), tantalum nitride (TaN), tantalum aluminum nitride (TaAlN), and the like.

The upper metal layers 305 of the MPM structures 115C are coupled to wires 323 in overlying metallization layer $M_n$ or $M_{n+1}$ by arrays of upper electrode vias 321. The lower metal layers 309 are coupled to wires 323 in underlying metallization layer $M_n$ or $M_{n-1}$ by arrays of lower electrode vias 325. Heat transport takes place through the vias 321, the wires 323, and the vias 325 in addition to taking place through the MPM structures 115C.

In some embodiments the thicknesses of the upper metal layer 305 and the lower metal layer 309 are in the range from about 5 nm to about 200 nm. In some embodiments the thicknesses of the upper metal layer 305 and the lower metal layer 309 are in the range from about 10 nm to about 100 nm. If these layers are too thin, lateral heat transport to the array of vias 321 and 325 may be too low. If these layers are too thick, electrical insulation may be too low. Making the upper metal layer 305 and the lower metal layer 309 thin facilitates adding additional layers to the MPM structures 115C.

The pyroelectric layers 307 comprise a pyroelectric material with a curie temperature in the range of 80 to 300° C. Examples of pyroelectric materials that may be suitable include lead zirconium titanate ($PbZrTiO_x$ or PZT); strontium barium titanate ($SrBaTiO_x$ or SBT); barium titanate ($BaTiO_3$ or BTO); orthorhombic hafnium oxide ($HfO_2$) doped with silicon (Si), lanthanum (La), zirconium (Zr), nitrogen (N), or the like; hafnium oxide-aluminum oxide ($HfO_2$—$Al_2O_3$) superlattice; hafnium oxide-zirconium oxide ($HfO_2$—$ZrO_2$) superlattice; combinations thereof, and the like.

In some embodiments a thickness of the pyroelectric layers 307 is in the range from about 2 nm to about 200 nm. In some embodiments the thickness of the pyroelectric layers 307 is in the range from about 5 nm to about 100 nm. If the pyroelectric layers 307 are too thick thermal transport resistance through the pyroelectric layers 307 may be excessive. If the pyroelectric layers 307 are too thin they may not have sufficient heat capacity to influence heat dissipation. As the number of pyroelectric layers in each MPM structure is increased the pyroelectric layers may be made thinner.

A distance $D_1$ between the metallization layers $M_{n-1}$ and $M_n$, may be in the range from about 50 nm to about 1000 nm. In some embodiments, the distance $D_1$ is from about 100 nm to about 500 nm. In some embodiments, a thickness $T_3$ of the MPM structure 115C is about one half or less the distance $D_1$. In some embodiments, the thickness $T_3$ is about one third or less the distance $D_1$. Limiting the thickness $T_3$ relative to the distance $D_1$ may improve heat transport between the metallization layers $M_{n-1}$ and $M_n$.

The lower metal layers of the MPM structures 115C that are between the metallization layers $M_n$ and $M_{n+1}$ are coupled with the upper metal layers 305 of the MPM structures 115C that are between the metallization layers $M_{n-1}$ and $M_n$. These and some other pairs of layers in a heat dissipation device 119C (having layers in addition to the ones illustrated) may be operated at a single potential. Operating certain pairs of layers at a single potential may reduce wiring requirements. In some embodiments, these coupled layers are maintained at a ground potential.

Figure 4:
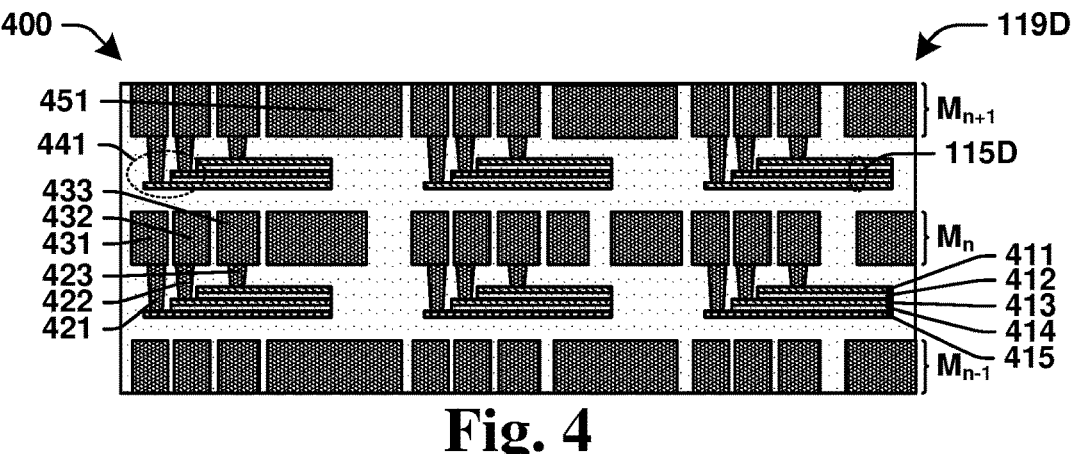
FIG. 4 illustrates a cross-sectional side view of a heat dissipation device according to some other aspects of the present disclosure.

FIG. 4 provides a cross-sectional view 400 illustrating a heat dissipation device 119D in accordance with some other embodiments of the present disclosure. The heat dissipation device 119D may be used as the heat dissipation device 119A in the IC device 101A or as the heat dissipation device 119B in the IC device 101B. The heat dissipation device 119D includes MPM structures 115D between adjacent pairs of metallization layers $M_{n-1}$, $M_n$, $M_{n+1}$.

The MPM structures 115D include a first pyroelectric layer 412 between an upper metal layer 411 and a middle metal layer 413 and a second pyroelectric layer 414 between the middle metal layer 413 and a lower metal layer 415. The compositional alternatives and thickness for the first pyroelectric layer 412 and the second pyroelectric layer 414 are the same as described for the pyroelectric layer 307. The compositional alternatives and thicknesses for the upper metal layer 411, the middle metal layer 413, and the lower metal layer 415 are the same as for the upper metal layer 305 and the lower metal layer 309.

Arrays of vias 423 connect the upper metal layers 411 to wires 433 in overlying metallization layers $M_n$ and $M_{n+1}$. Arrays of vias 422 connect the middle metal layers 413 to wires 432 in overlying metallization layers $M_n$ and $M_{n+1}$. Arrays of vias 421 connect the lower metal layers 415 to wires 431 in overlying metallization layers $M_n$ and $M_{n+1}$. The metal layers in the MPM structures 115D are staggered to form a staircase pattern 441. The staircase pattern 441 provides landing spots for the vias 421 and 422. Wires 451 are disposed between the wires 431, 432, and 433. In some embodiments, the wires 451 are coupled with circuits of a PMIC beneath a metal interconnect that contains the heat dissipation device 119D. In some embodiments, the wires 451 are part of a dummy metal pattern.

Figure 5:
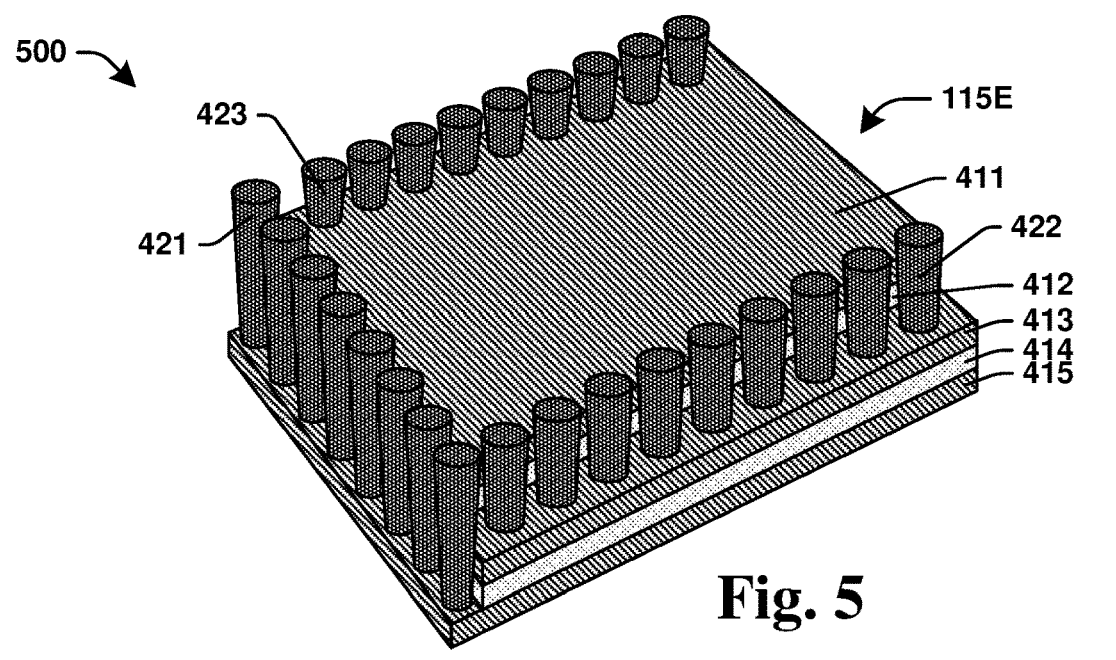
FIG. 5 illustrates a perspective view of a heat dissipation device according to some other aspects of the present disclosure.

FIG. 5 provides a perspective view 500 of an MPM structure 115E according to some aspects of the present disclosure. The MPM structure 115E is similar to the MPM structure 115D but has a staircase pattern that wraps around two sides. In this alternate staircase pattern the vias 422 are arranged in a row that is perpendicular to a row of the vias 421. MPM structures 115D and 115E may be mixed together in a heat dissipation device to provide flexibility in the arrangement of wiring.

Figure 6:
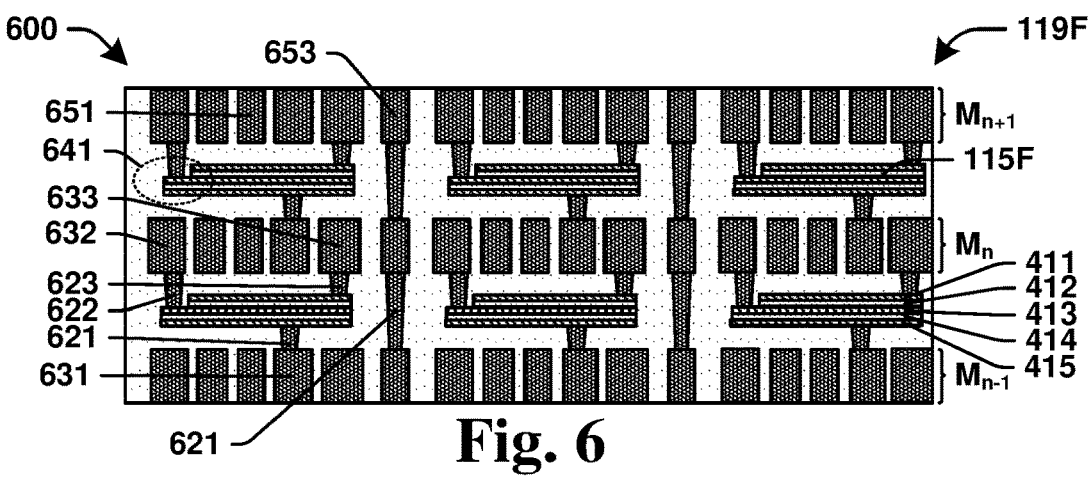
FIG. 6 illustrates a cross-sectional side view of a metal interconnect with a heat dissipation device according to some aspects of the present disclosure.

FIG. 6 provides a cross-sectional view 600 illustrating a heat dissipation device 119F in accordance with some other embodiments of the present disclosure. The heat dissipation device 119F may be used as the heat dissipation device 119A in the IC device 101A or as the heat dissipation device 119B in the IC device 101B. The heat dissipation device 119F includes MPM structures 115F between adjacent pairs of metallization layers $M_{n-1}$, $M_n$, and $M_{n+1}$.

The MPM structures 115F contain the same number and types of layers as the MPM structures 115D of FIG. 4 but differ in the way the metal layers are coupled to wires in the adjacent metallization layers. In the MPM structures 115F, the upper metal layers 411 are coupled to wires 633 in overlying metallization layers $M_n$ and $M_{n+1}$ by arrays of vias 623. The middle metal layers 413 are coupled to wires 632 in the overlying metallization layers $M_n$ and $M_{n+1}$ by arrays of vias 622 which land on a stepped edge 641. The lower metal layers 415 are coupled to wires 631 in underlying metallization layers $M_n$ and $M_{n-1}$ by arrays of vias 621. Wires 653 are disposed in the metallization layers $M_{n-1}$, $M_n$, and $M_{n+1}$ between the wires 631, 632, and 633. The wires 653 may be coupled with circuits of a PMIC through vias 621. Wires 651 may also be coupled with circuits of the PMIC or may be dummy metal patterning.

Figure 7:
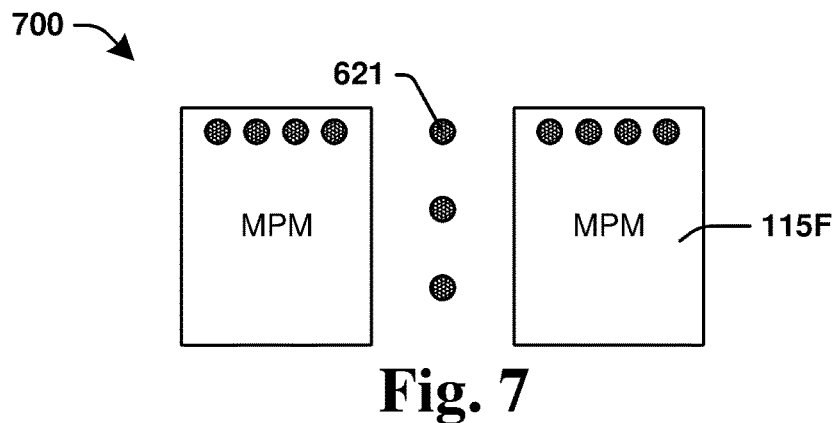
FIG. 7 illustrates a plan view of two MPM structures in a heat dissipation device according to some aspects of the present disclosure.
Figure 8:
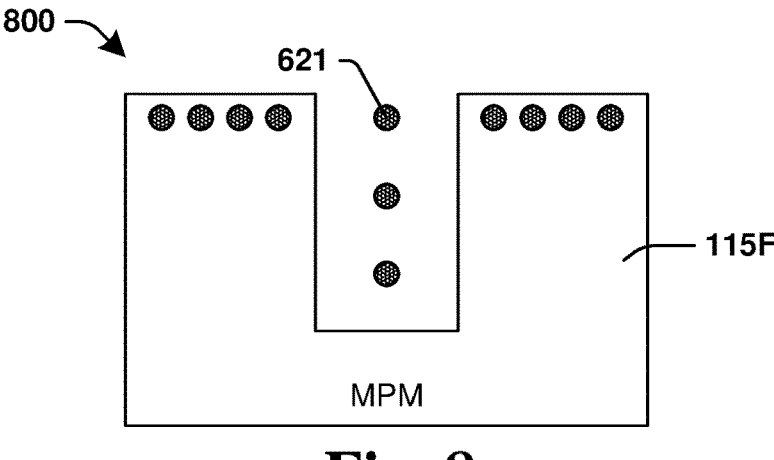
FIG. 8 illustrates a plan view of an MPM structure in a heat dissipation device according to some other aspects of the present disclosure.

FIG. 7 provides a plan view 700 illustrating a way in which the MPM structures 115F may be arranged around the vias 621. As shown in FIG. 7, vias 621 may be disposed between two distinct MPM structures 115F within an adjacent pair of metallization layers $M_{n-1}$, $M_n$, and $M_{n+1}$. The two distinct MPM structures 115F may be connected in parallel. FIG. 8 provides a plan view 800 illustrating another way in which the MPM structures 115F may be arranged around the vias 621. As shown in FIG. 8, a single MPM structure 115F may wrap around vias 621 whereby the MPM structures 115F is disposed on two directly opposite sides of each of the vias 621. The MPM structures 115F may be arranged to accommodate a routing structure. Accordingly, in some embodiments MPM structures 115F corresponding to the plan view 700 and MPM structures 115F corresponding to the plan view 700 both occur within an adjacent pair of the metallization layers $M_{n-1}$, $M_n$, and $M_{n+1}$.

FIG. 9 provides a flow chart of a computer-aided integrated circuit design process 900 in accordance with some aspects of the present disclosure. The first act 901 is opening an integrated circuit layout file. The file may have any suitable format for computer-aided integrated circuit design. For example, the format may be Library Exchange Format (LEF), Design Exchange Format (DEF), Milkyway database file format, SPICE file format, Circuit Description Language (CDL) file format, and Graphic Database System (GDSII) stream file format, or the like.

Act 903 is inserting specifications for an oxide definition (OD) mask. The OD mask defines active areas for the device. Act 905 is inserting components of a PMIC into one of the active areas. The components may include various high voltage devices. The high voltage devices may include transistors, diodes, capacitors, or the like. Act 907 is inserting a routing structure. The routing structure provides connections for the PMIC. The connections are of the type made in a metal interconnect over the PMIC.

Act 909 is inserting MPM structures. The MPM structures are inserted between vias of the previously defined routing structure in areas over the PMIC. Act 911 is inserting routing for the MPM structures. This includes wires for setting voltages on the metal layers and arrays of vias for coupling the wires to the metal layers.

Act 913 is an optional act of inserting dummy fill. The dummy fill is inserted in accordance with design rules. Dummy fill reduces dishing during chemical mechanical polishing (CMP). The amount of dummy fill is made less or eliminated by inserting the routing for the MPM structures.

Figure 11:
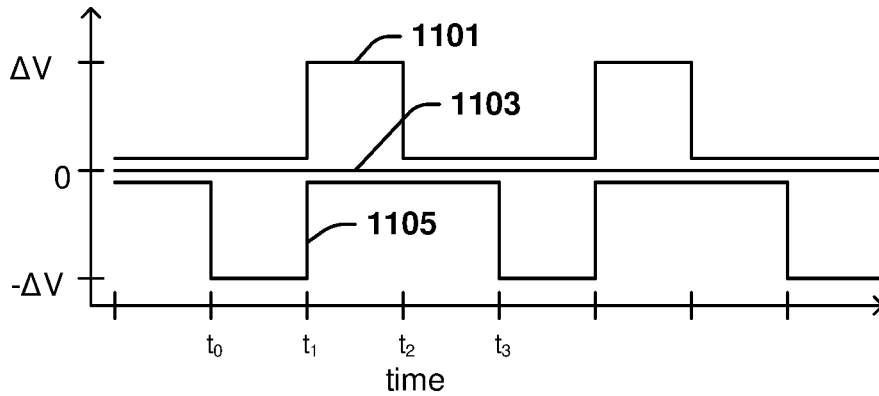
FIG. 11 is a plot showing the application of voltages to electrodes in an MPMPM structure according to some aspects of the present disclosure.
Figure 12:
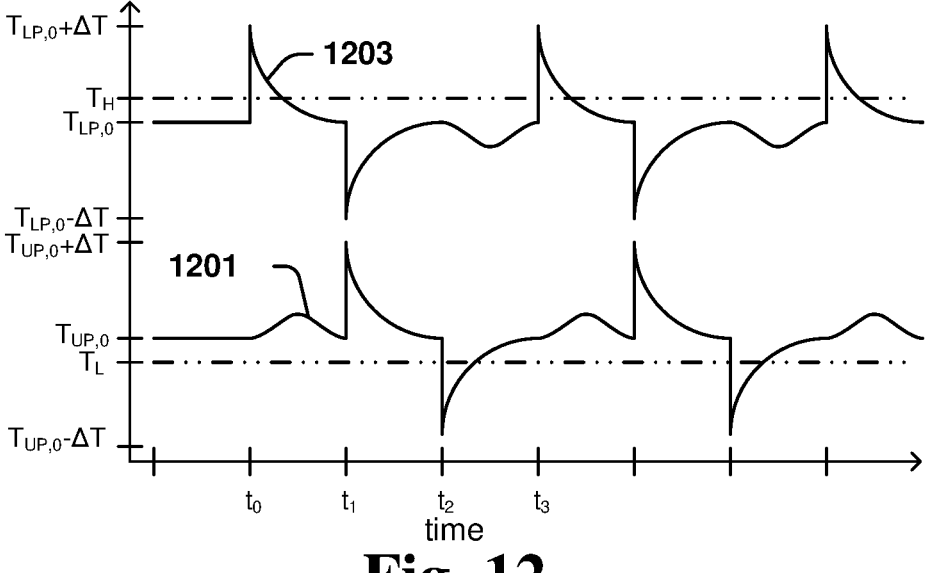
FIG. 12 is a plot showing temperature variations induced by the method of FIGS. 10 and 11.
Figure 13A:
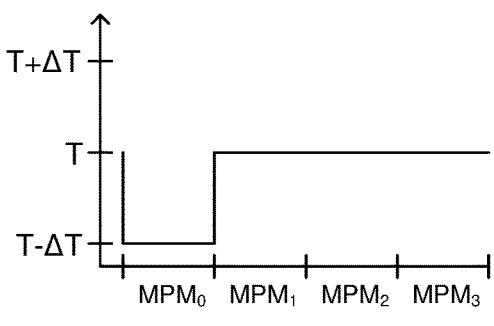
FIGS. 13A-13E are a series of plots illustrating a method of operating a heat dissipation device in accordance with some aspects of the present disclosure.
Figure 13B:
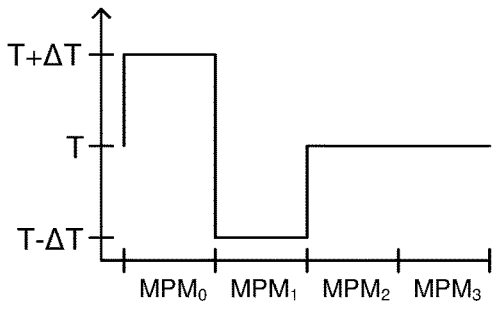
Figure 13C:
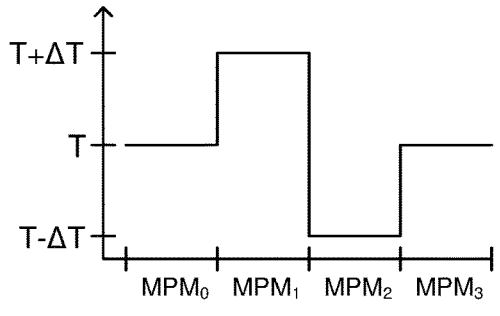
Figure 13D:
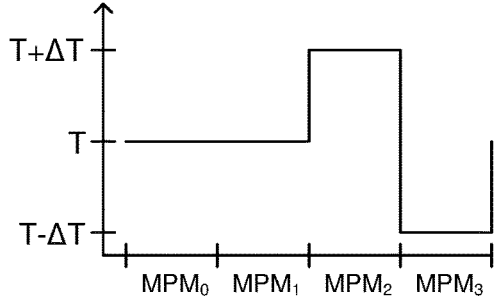
Figure 13E:
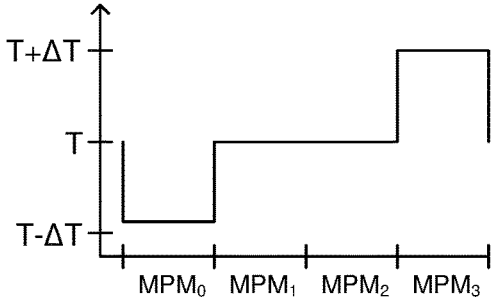

FIG. 10 provides a method 1000 of operating a heat dissipation device according to the present disclosure to enhance heat transfer. The method 1000 focuses on an MPMPM structure. FIG. 11 illustrates the voltages of a top electrode 1101, a middle electrode 1103, and a bottom electrode 1105 that result from application of the method 1000. FIG. 12 illustrates the effects on temperatures of an upper pyroelectric layer 1201 and a lower pyroelectric layer 1203. The method of FIG. 10 is described in more detail below with reference to FIGS. 3, 4, 11, and 12.

With reference to FIG. 3, the lower pyroelectric layer 1203 could be in the MPM structure 115CL and the upper pyroelectric layer 1201 could be in the MPM structure 115CU. The top electrode 1101 could be the upper metal layer 305 of the MPM structure 115CU. The middle electrode 1103 could be a lower metal layer 309 of the MPM structure 115CU combined with the upper metal layer 305 of the MPM structure 115CL, which are coupled through the vias 321 and 325 and the wire 323. The bottom electrode 1105 could be the lower metal layer 309 of the MPM structure 115CL. As another alternative, with reference to FIG. 4, the top electrode 1101, the upper pyroelectric layer 1201, the middle electrode 1103, the lower pyroelectric layer 1203 and the bottom electrode 1105 could be the upper metal layer 411, the first pyroelectric layer 412, the middle metal layer 413, the second pyroelectric layer 414, and the lower metal layer 415 respectively of any one of the MPM structures 115D.

FIG. 12 shows the temperature of the upper pyroelectric layer 1201 and the temperature of the lower pyroelectric layer 1203 in comparison to a high temperature $T_H$ and low temperature $T_L$. The high temperature $T_H$ is the temperature of a hot body one side of the MPMPM structure. The low temperature $T_L$ is the temperature of a cooler body on an opposite side of the MPMPM structure. $T_{UP,0}$ are $T_{LP,0}$ steady state temperatures of the upper pyroelectric layer and the lower pyroelectric layer respectively before operating the heat dissipation device. Most of the resistance to heat flow is initially provided by the pyroelectric layers, which also provide electrical insulation.

Initially, the top electrode 1101, the middle electrode 1103, and the bottom electrode 1105 are at a ground potential. The method 1000 begins with act 1001, lowering the voltage of the bottom electrode 1105. This is the event illustrated at $t_0$ in FIG. 11. Lowering the voltage of the bottom electrode 1105 while the middle electrode 1103 is grounded applies an electric field to the lower pyroelectric layer 1203 causing its dipoles to align. This alignment of dipoles causes an adiabatic increase in temperature of the lower pyroelectric layer 1203 through the electrocaloric effect. The temperature increases to approximately $\Delta T$ above its starting temperature $T_{LP,0}$.

Act 1003 is allowing heat to flow from the condition created by act 1001. During this period, heat transfer from the hot side to the cold side is actually reduced. In the following two periods, heat transfer from the hot side to the cold side is increased. The net effect is an increase in heat transfer from the hot side to the cold side.

Act 1005 includes both raising the voltage of the top electrode 1101 and raising the voltage of the bottom electrode 1105. This is the event illustrated at $t_1$ in FIG. 11. Raising the voltage of the bottom electrode 1105 relaxes the electric field on the lower pyroelectric layer 1203. The dipoles of the lower pyroelectric layer 1203, no longer constrained to alignment, adiabatically take up thermal energy resulting in the temperature of the lower pyroelectric layer 1203 dropping suddenly as shown in FIG. 12. Simultaneously, the temperature on the lower pyroelectric layer 1203 is increased by the application of an electric field.

Act 1007 is allowing heat to flow from the condition created by act 1005. During this period, the temperature of the lower pyroelectric layer 1203 is considerably below its initial steady state value of temperature $T_{LP,0}$. This lower temperature results in greater heat transfer from the hot side.

Act 1009 is dropping the voltage of the top electrode 1101. This is the event illustrated at $t_2$ in FIG. 11. As shown in FIG. 12, this decreases the temperature of the upper pyroelectric layer 1201.

Act 1011 is allowing heat to flow from the condition created by act 1009. The decreased temperature of the upper pyroelectric layer 1201 causes a decrease in temperature of the lower pyroelectric layer 1203. Accordingly, heat transfer from the hot side is increased during this period also.

Following act 1011, at $t_3$, as shown in FIG. 11, all the voltages have returned to their initial conditions. Accordingly Acts 1001-1011 may be repeated cyclically to drive heat transfer. The plots of FIG. 12 assume that $T_H$ and $T_L$ remain constant. In practice $T_H$ may be reduced. Also, the plots show the temperatures returning to equilibrium values between times at which voltages are switched. In practice, the switching times may be accelerated.

FIGS. 13A-13E illustrate a method according to the present disclosure of operating three or more MPM structures to drive heat transfer. In the initial condition, an electric field may be applied to the pyroelectric layers in each of $MPM_0$ to $MPM_3$. In the first phase, illustrated by FIG. 13A, the electric field on $MPM_0$ is relaxed, causing its temperature to drop. In the second phase, illustrated by FIG. 13B, the electric field on $MPM_0$ is reapplied while the electric field on $MPM_1$ is relaxed. In the third phase, illustrated by FIG. 13C, the electric field on $MPM_1$ is reapplied while the electric field on $MPM_2$ is relaxed. In the fourth phase, illustrated by FIG. 13D, the electric field on $MPM_2$ is reapplied while the electric field on $MPM_3$ is relaxed. In the fifth phase, illustrated by FIG. 13E, the electric field on $MPM_3$ is reapplied while the electric field on $MPM_0$ is again relaxed. In accordance with this method, heat may be driven from the hot side to the cold side in a wave-like manner.

FIGS. 14 through 32 are cross-sectional view illustrations exemplifying a method according to the present disclosure of forming a heat dissipation device according to the present disclosure within a metal interconnect. While FIGS. 14 through 32 are described with reference to various embodiments of a method, it will be appreciated that the structures shown in FIGS. 14 through 32 are not limited to the method but rather may stand alone separate from the method. FIGS. 14 through 32 are described as a series of acts. The order of these acts may be altered in other embodiments. While FIGS. 14 through 32 illustrate and describe a specific set of acts, some may be omitted in other embodiments. Further, acts that are not illustrated and/or described may be included in other embodiments.

Figure 14:
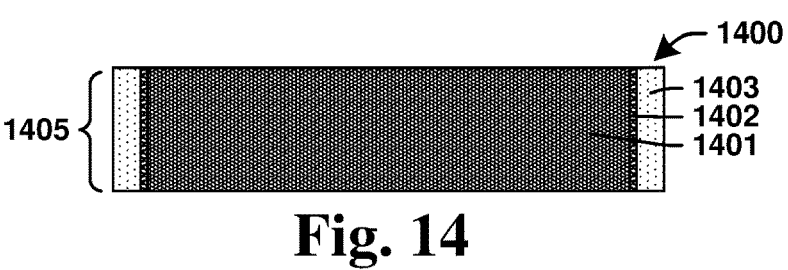
FIGS. 14-32 are a series of cross-sectional view illustrations exemplifying a method of forming an IC device in accordance with some aspects of the present disclosure.

As shown by the cross-sectional view 1400 of FIG. 14, the method may begin by providing a substrate (not shown) over which a metallization layer 1405 has been formed. The metallization layer 1405 contains a wire 1401 surrounded by an interlevel dielectric (ILD) 1403. A diffusion barrier layer 1402 separates the wire 1401 from the ILD 1403.

The wire 1401 may be any suitable conductor. In some embodiments, the wire 1401 is a metal. Examples of metals that may be suitable include tungsten (W), aluminum (Al), copper (Cu), titanium (Ti), tantalum (Ta), cobalt (Co), nickel (Ni), ruthenium (Ru), and the like. In some embodiments, the metal is copper (Cu), aluminum (Al), a combination thereof, or the like. In some embodiments, the metal is copper (Cu) or the like. The diffusion barrier layer 1402 may be, for example, tantalum nitride (TaN), titanium nitride (TiN), tungsten nitride (WN), or the like. The ILD layer 1403 may be a low-κ dielectric, or an extremely low-κ dielectric. The ILD 1403 layer may be, for example, silicon dioxide ($SiO_2$), borosilicate glass (BSG), phosphorus silicate glass (PSG), borophosphosilicate glass (BPSG), fluorosilicate glass (FSG), undoped silicate glass (USG), or the like.

Figure 15:
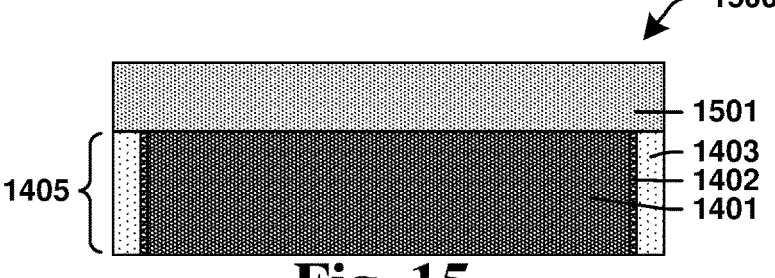

As shown by the cross-sectional view 1500 of FIG. 15, a dielectric layer 1501 is formed over the metallization layer 1405. The dielectric layer 1501 may include one or more layers of dielectrics. The dielectrics may be, for example, silicon dioxide ($SiO_2$), silicon nitride (SiN), silicon carbide (SiC), silicon carbonitride (SiCN), silicon oxycarbide (SiOC), silicon oxycarbonitride (SiOCN), or the like. The dielectrics may be deposited by physical vapor deposition (PVD), chemical vapor deposition (CVD), atomic layer deposition (ALD), the like, or any suitable process.

Figure 16:
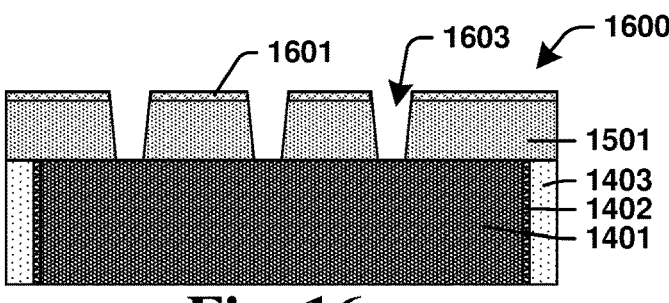

As shown by the cross-sectional view 1600 of FIG. 16, a mask 1601 is formed and used to etch openings 1603 in the dielectric layer 1501. The wire 1401 is exposed through the openings 1603. The mask 1601 may be formed using photolithography. The etch process may be a dry etch process such as a plasma etch. After etching, the mask 1601 may be stripped.

Figure 17:
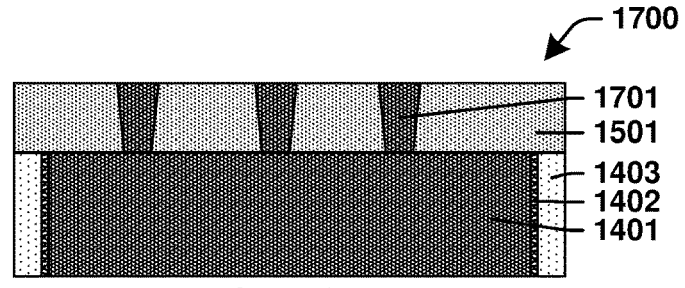

As shown by the cross-sectional view 1700 of FIG. 17, the openings 1603 may be filled with conductive material followed by a planarization process to form the vias 1701 in the dielectric layer 1501. The conductive material may include one or more layers of metals or metal compounds. The conductive material may be, for example, tungsten (W), aluminum (Al), copper (Cu), titanium (Ti), tantalum (Ta), cobalt (Co), nickel (Ni), ruthenium (Ru), tantalum nitride (TaN), titanium nitride (TiN), tungsten nitride (WN), a combination thereof, or the like. The deposition process may be, for example, ALD, CVD, PVD, electroplating, electroless plating, or the like. The planarization process may be, for example, chemical mechanical polishing (CMP) or the like.

Figure 18:
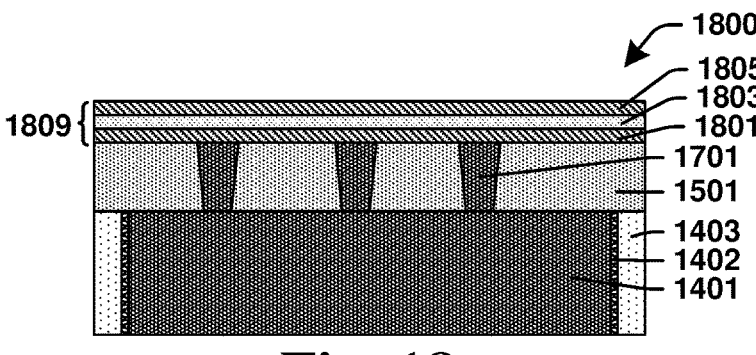

As shown by the cross-sectional view 1800 of FIG. 18, an MPM stack 1809 is formed over the dielectric layer 1501. The MPM stack includes at least a lower metal layer 1801, a pyroelectric layer 1803, and an upper metal layer 1805. The lower metal layer 1801 contacts the vias 1701. The lower metal layer 1801, the pyroelectric layer 1803, and the upper metal layer 1805 may be formed by ALD, CVD, PVD, electroplating, electroless plating, a combination thereof, or the like. In some embodiments, the MPM stack 1809 is formed by ALD. ALD provides precise control of layer compositions and thicknesses which facilitates providing the MPM stack 1809 with many layers and well defined physical properties.

Figure 19:
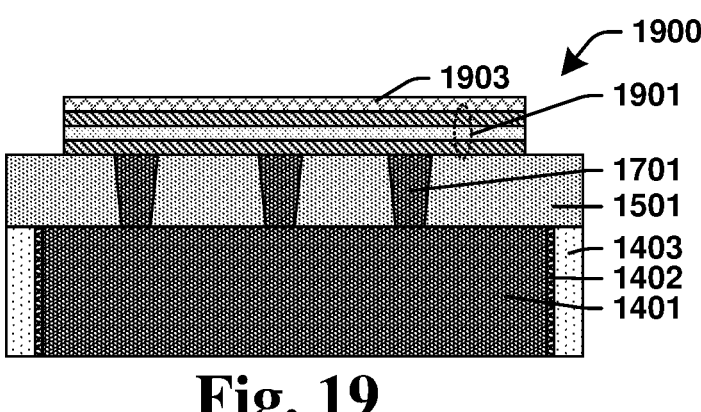

As shown by the cross-sectional view 1900 of FIG. 19, a mask 1903 is formed and an etch process is carried out to define an MPM structure 1901 from the MPM stack 1809. The mask 1903 may be formed using photolithography. The etch process may be a dry etch process such as a plasma etch. After etching, the mask 1903 may be stripped.

Figure 20:
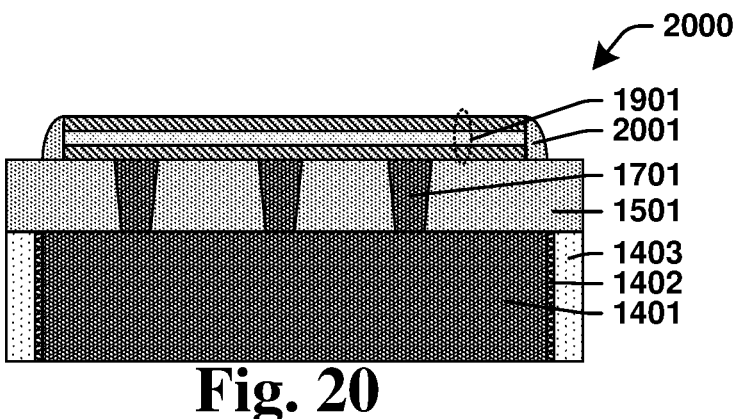

As shown by the cross-sectional view 2000 of FIG. 20, sidewall spacers 2001 may be formed around the MPM structures 1901. The sidewall spacers 2001 may include one or more layers of dielectrics such as, for example, silicon dioxide ($SiO_2$), silicon nitride (SiN), silicon carbide (SiC), silicon carbonitride (SiCN), silicon oxycarbide (SiOC), silicon oxycarbonitride (SiOCN), or the like. The process of forming the sidewall spacers 2001 may include depositing a spacer material by CVD, PVD, or the like followed by a dry etch process such as plasma etching.

Figure 21:
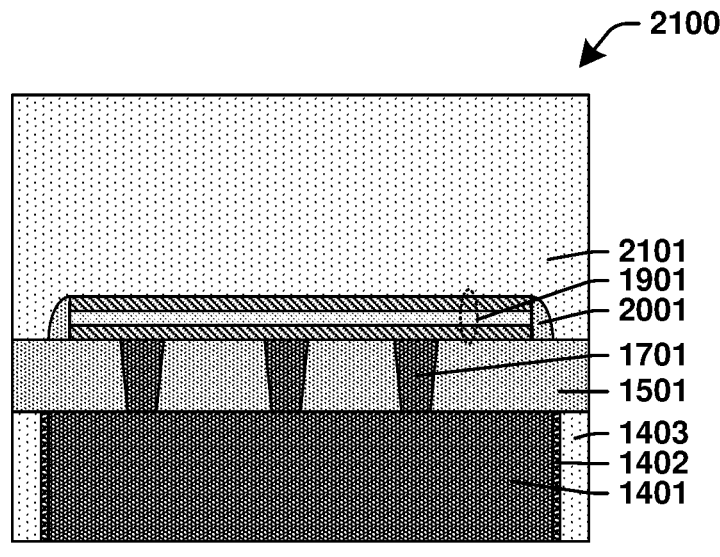

As shown by the cross-sectional view 2100 of FIG. 21, an ILD layer 2101 may be formed over the MPM structure 1901. The ILD may be formed by ALD, CVD, PVD, the like, or any other suitable process.

Figure 22:
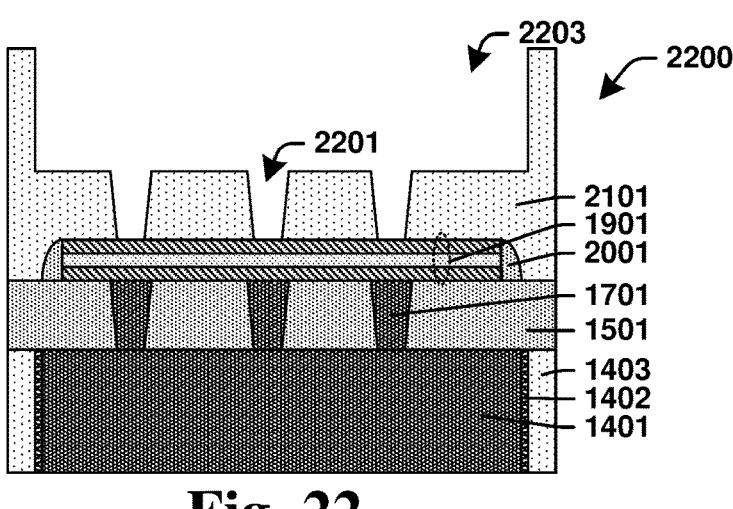

As shown by the cross-sectional view 2200 of FIG. 22, a trench 2203 may be formed in the ILD layer 2101. The MPM structure 1901 is exposed through openings 2201 at a base of the trench 2203. The trenches 2203 and the opening 2201 are formed in a dual damascene process. The dual damascene process may be a trench first process or a via first process. Alternatively, two single damascene processes may be used.

Figure 23:
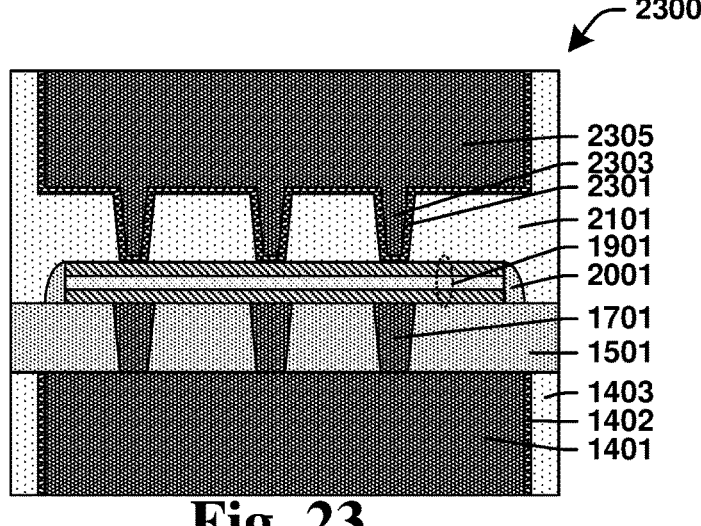

As shown by the cross-sectional view 2300 of FIG. 23, after lining the trench 2203 and the opening 2201 with a diffusion barrier layer 2301, the trench 2203 and the opening 2201 are filled with a conductive material followed by planarization to form a wire 2305 and vias 2303. The diffusion barrier layer 2301 may be the same material as the diffusion barrier layer 1402 or a different material. The conductive material may be the same material as the wire 1401 or a different material.

Figure 24:
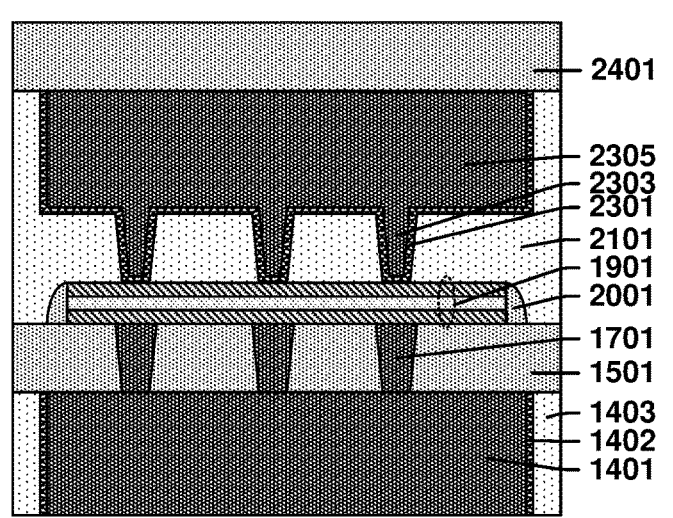

As shown by the cross-sectional view 2400 of FIG. 24, a dielectric layer 2401 is formed over the structure shown by the cross-sectional view 2300 of FIG. 23. The dielectric layer 2401 may be the same or different from the dielectric layer 1501 and may be formed by the same process or a different process.

Figure 25:
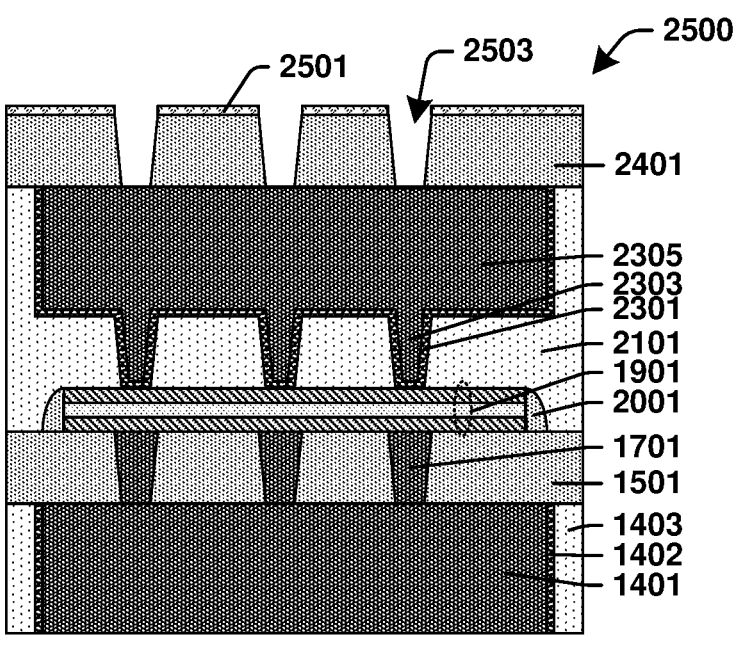

As shown by the cross-sectional view 2500 of FIG. 25, a mask 2501 is formed and used to etch openings 2503 in the dielectric layer 2401. The wire 2305 is exposed through the openings 2503. The mask 2501 may be formed using photolithography. The etch process may be a dry etch process such as a plasma etch. After etching, the mask 2501 may be stripped.

Figure 26:
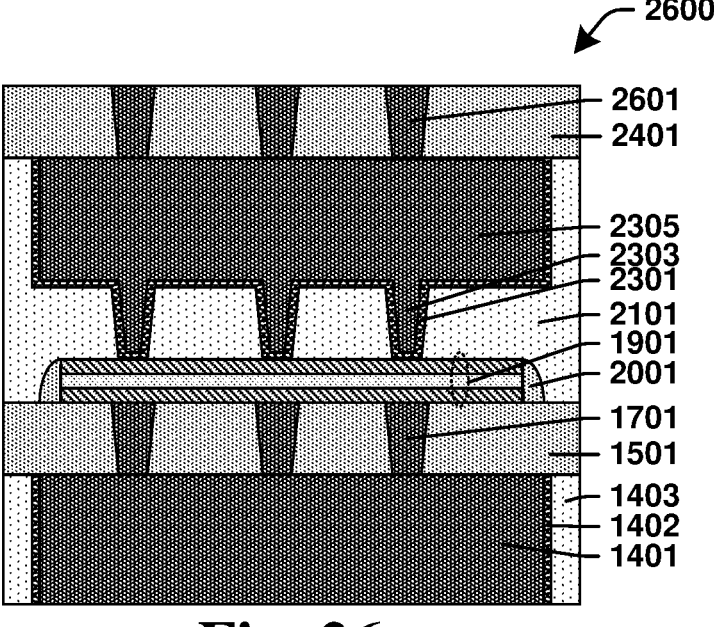

As shown by the cross-sectional view 2600 of FIG. 26, the openings 1503 may be filled with conductive material followed by a planarization process to form the vias 2601. The conductive material may be the same or different from that of the vias 1701 and the vias 2601 may be formed by the same process or a different process.

Figures 27, 28:
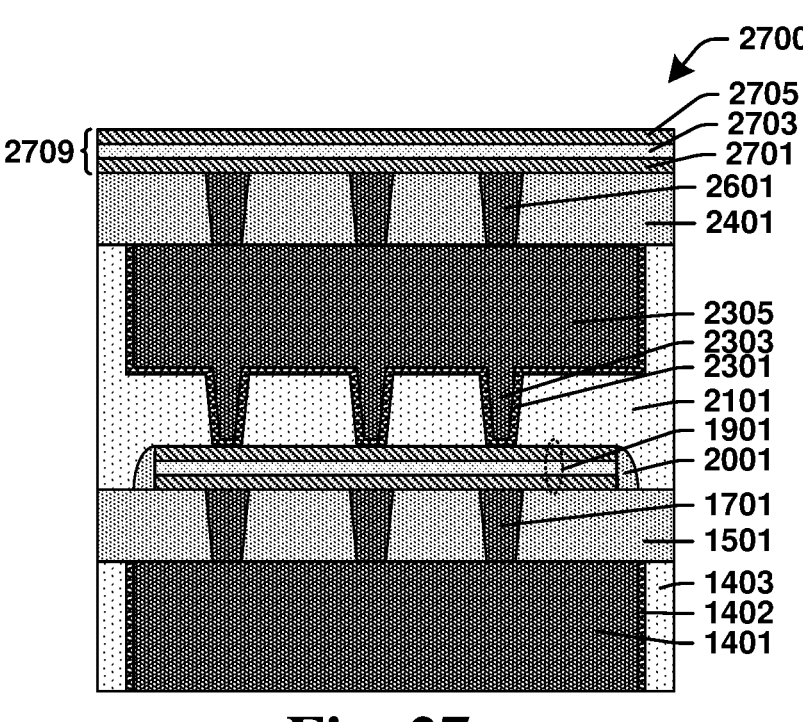

As shown by the cross-sectional view 2700 of FIG. 27, an MPM stack 2709 is formed over the dielectric layer 2401. The MPM stack includes at least a lower metal layer 2701, a pyroelectric layer 2703, and an upper metal layer 2705. The lower metal layer 2701 contacts the vias 2601. The MPM stack 2709 may have the same composition as the as the MPM stack 1809 or a different composition and may be formed by the same process or a different process.

As shown by the cross-sectional view 2800 of FIG. 28, a mask 2803 is formed and an etch process is carried out to define an MPM structure 2801 from the MPM stack 2709. The mask 2803 may be formed using photolithography. The etch process may be a dry etch process such as a plasma etch. After etching, the mask 2803 may be stripped.

Figure 29:
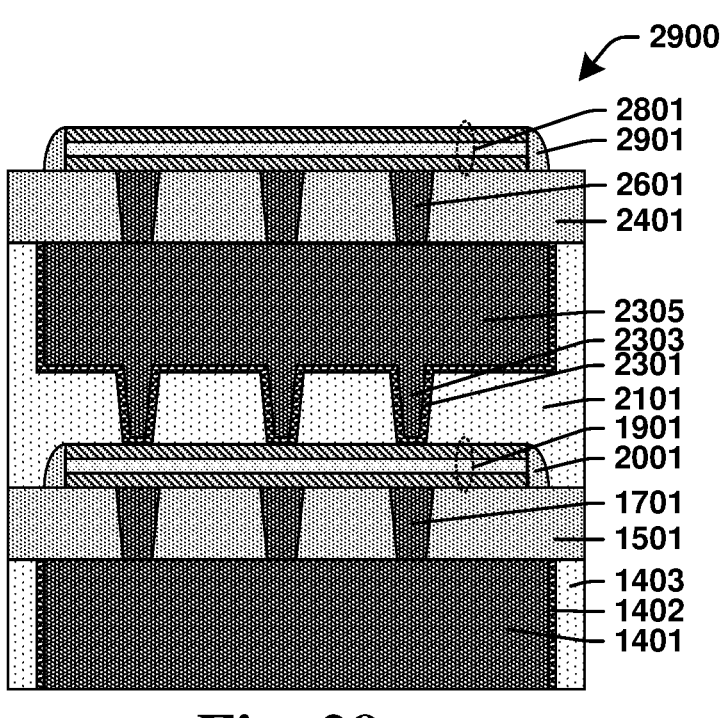

As shown by the cross-sectional view 2900 of FIG. 29, sidewall spacers 2901 may be formed around the MPM structures 2801. The sidewall spacers 2901 may have the same composition as the as the sidewall spacers 2001 or a different composition and may be formed by the same process or a different process.

Figure 30:
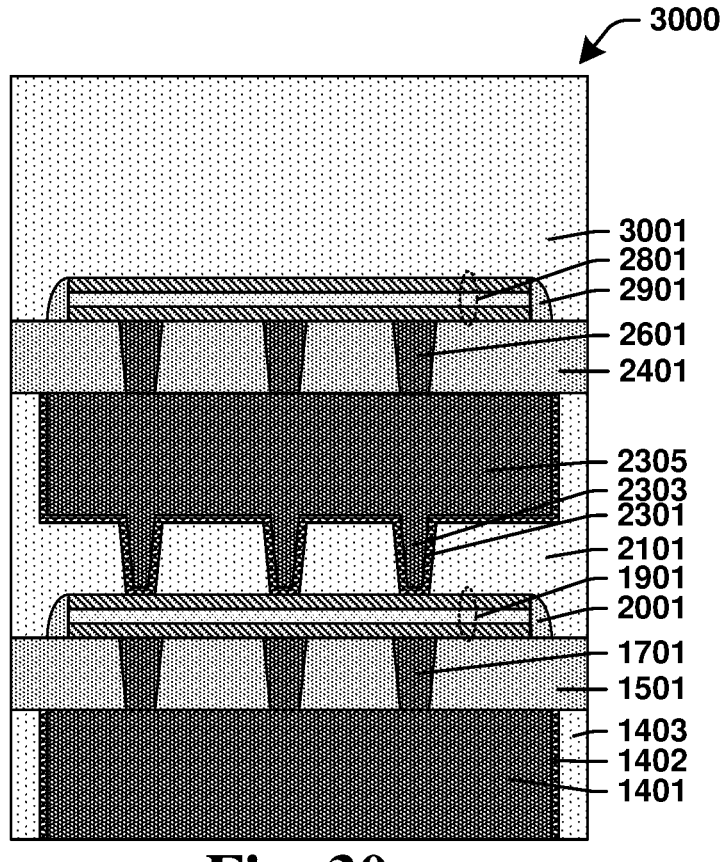

As shown by the cross-sectional view 3000 of FIG. 30, an ILD layer 3001 may be formed over the MPM structure 2801. The ILD layer 3001 may have the same composition as the as the ILD layer 2101 or a different composition and may be formed by the same process or a different process.

Figure 31:
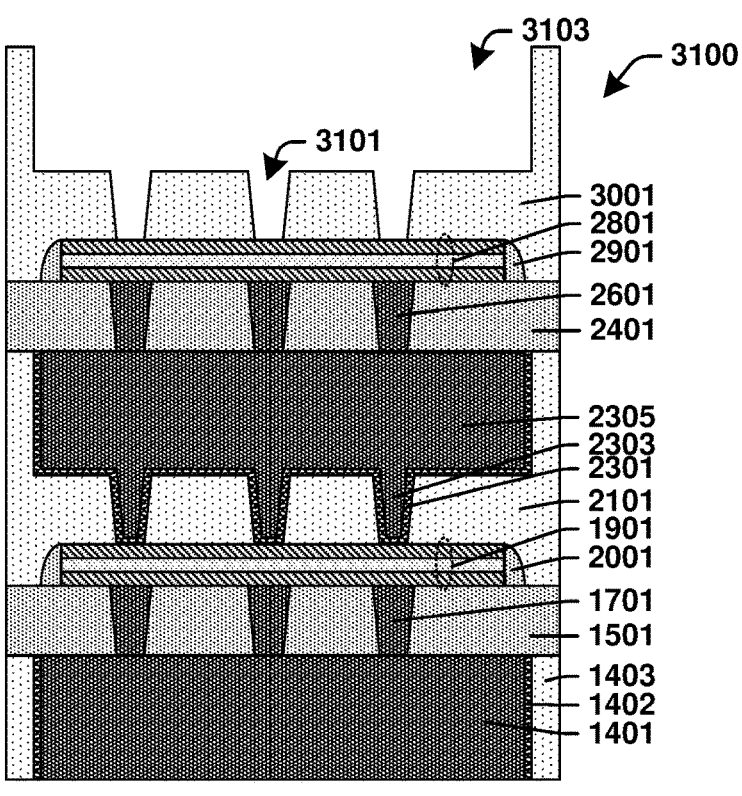

As shown by the cross-sectional view 3100 of FIG. 31, a trench 3103 may be formed in the ILD layer 3001. The MPM structure 2801 is exposed through openings 3101 at a base of the trench 3103. The process of forming the trenches 3103 and the opening 3101 may be the same as or different from the process of forming trenches 2203 and the opening 2201.

Figure 32:
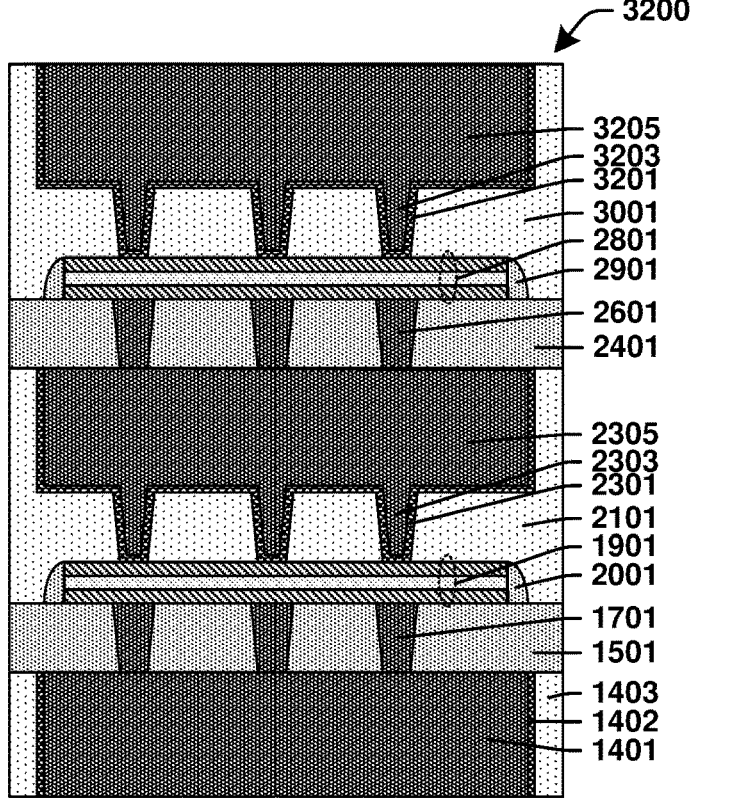

As shown by the cross-sectional view 3200 of FIG. 32, after lining the trench 3103 and the opening 3101 with a diffusion barrier layer 3201, the trench 3103 and the opening 3101 are filled with a conductive material followed by planarization to form a wire 3205 and vias 3203. The diffusion barrier layer 3201, the vias 3203, and the wire 3205 may have the same compositions as the as the diffusion barrier layer 2301, the vias 2303, and the wire 2305 respectively and may be formed by the same processed or different processes.

Figure 33:
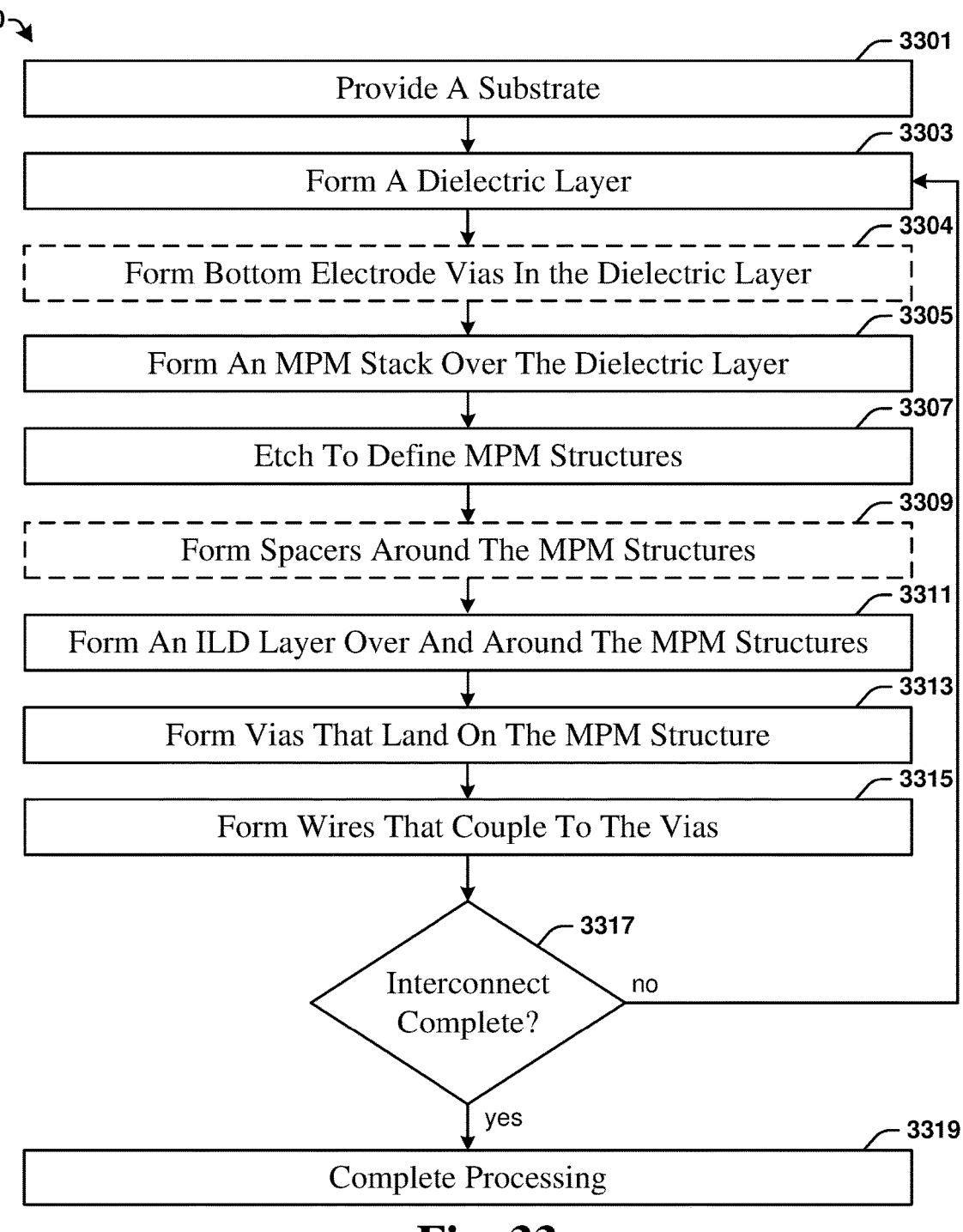
FIG. 33 provides a flow chart illustrating a method of forming an IC device in accordance with some aspects of the present disclosure.

FIG. 33 presents a flow chart for a process 3300 that may be used to form a heat dissipation device according to the present disclosure. While the process 3300 of FIG. 33 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

The process 3300 begins with act 3301, providing a substrate. The substrate may include a semiconductor wafer. One or more metallization layers may have already been formed on the substrate. The metallization layers may be on a front side or a back side. The process 3300 may be applied to the front side or the back side.

Act 3303 is forming a dielectric layer. The cross-sectional view 1500 of FIG. 15 provides an example. This dielectric layer provides spacing between a subsequently formed MPM structure and an underlying metallization layer or other structure.

Act 3304 is an optional step of forming bottom electrode vias in the dielectric layer. The cross-sectional views 1600 and 1700 of FIGS. 16 and 17 provide an example. These bottom electrode vias are optional in that some MPM structures do not require them. For example, the MPM structures 115D of FIG. 4 do not require bottom electrode vias.

Act 3305 is forming an MPM stack over the dielectric layer. The MPM stack may include, one, two, three, or more pyroelectric layers interleaved with metal layers. The cross-sectional view 1800 of FIG. 18 provides an example.

Act 3307 is etching the MPM stack to form individual MPM structures. The cross-sectional view 1900 of FIG. 19 provides an example. Etching may provide staircase patterns in the sides of the MPM structure. The MPM structure 115D of FIG. 4, the MPM structure 115E of FIG. 5, and the MPM structure 115F of FIG. 6 are examples of MPM structures with staircase patterns.

Act 3309 is an optional step of forming sidewall spacers around the MPM structures. The cross-sectional view 2000 of FIG. 20 provides an example.

Act 3311 is forming an ILD layer over and around the MPM structures. The cross-sectional view 2100 of FIG. 21 provides an example.

Act 3313 is forming vias that land on the MPM structures. Act 3315 is forming wires that couple to those vias. The actions may be combined in a dual damascene process. The cross-sectional views 2200 and 2300 of FIGS. 22 and 23 provide an example.

Act 3317 is determining whether an interconnect structure that contains the wires is complete. If not, acts 3303 to 3315 may be repeated to extend the heat dissipation device through additional layers of the metal interconnect. The cross-sectional views 2400 through 3200 of FIGS. 24 through 32 provide an example.

Act 3319 is additional processing that takes place after the metal interconnect is complete. That additional processing may include packaging.

Figure 34:
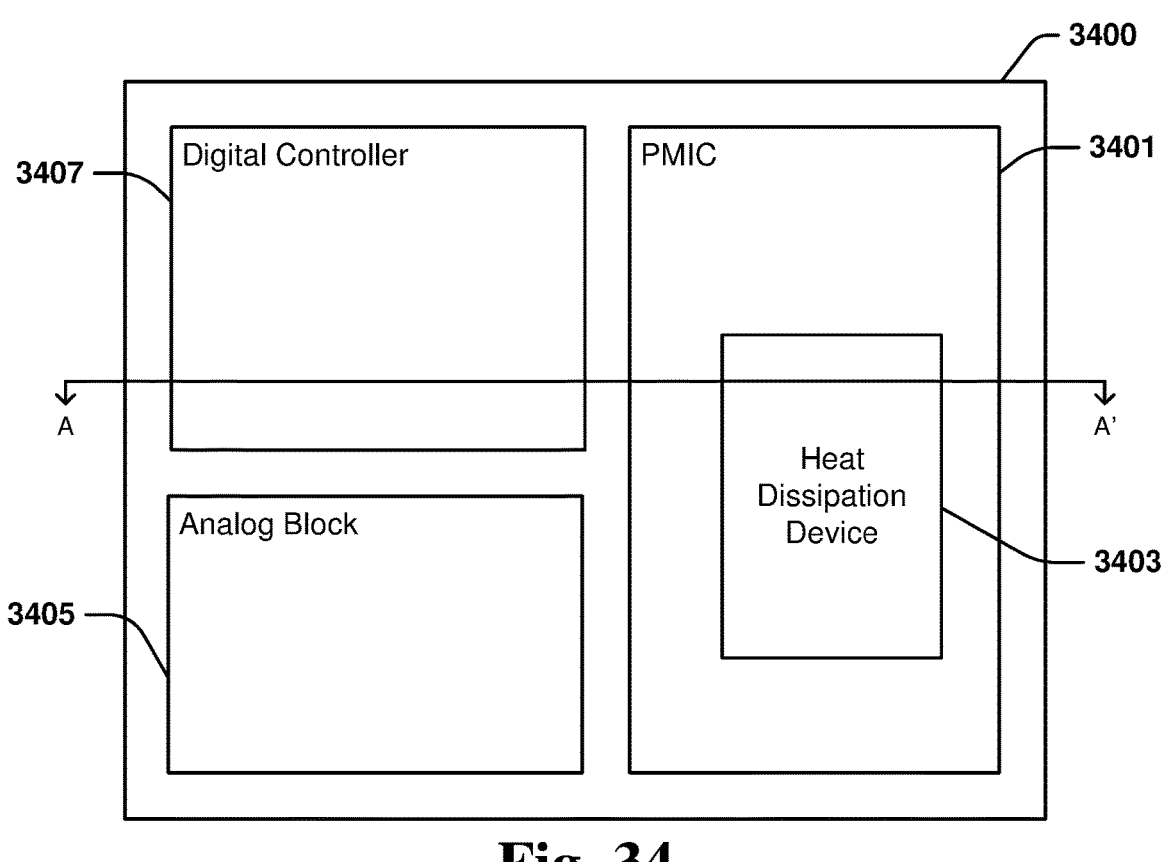
FIG. 34 is a plan view of a system-on-chip (SoC) device in accordance with some aspects of the present disclosure.

FIG. 34 illustrates a layout for a system on chip (SoC) 3400 that includes a heat dissipation device 3403 according to the present disclosure. The SoC 3400 includes a logic chip 3407 that provides a digital controller, an analog chip 3405 that provides analog devices, and a power management chip 3401 that include a PMIC and a heat dissipation device 3403 over or under the PMIC.

Figure 35:
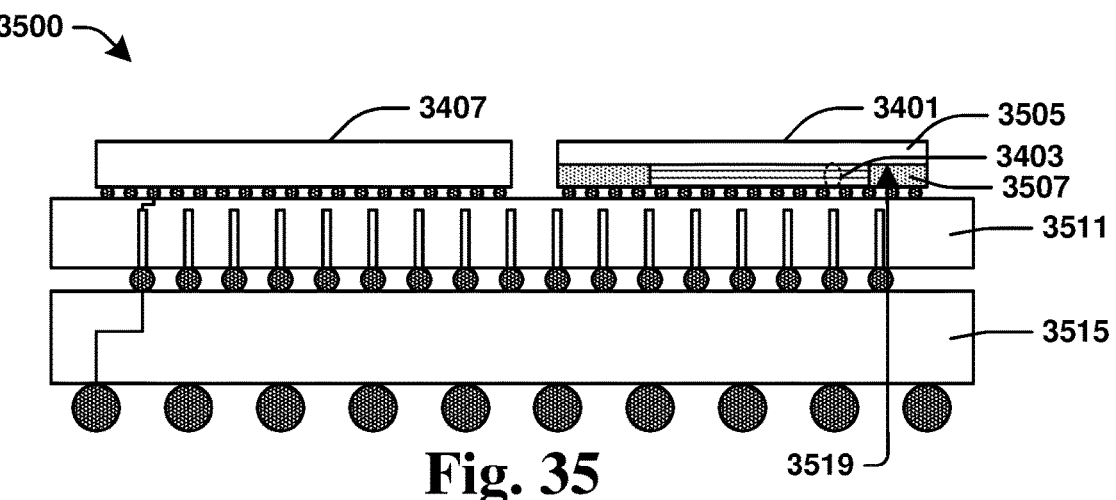
FIG. 35 is a cross-sectional view of a 3D IC package in accordance with some aspects of the present disclosure.

FIG. 35 provides a cross-sectional view illustration of a 3D package 3500 having the layout of SoC 3400. The cross-section is taken through the line A-A' of FIG. 34. The 3D package 3500 is of the System-on-Wafer-on-Chip (SoWoC) variety and include an interposer 3511 that provides communication among the logic chip 3407, the analog chip 3405, and the power management chip 3401 and couples them to a package substrate 3515. The power management chip 3401 includes a substrate 3505 and a metal interconnect 3507 on a front side 3519 of the substrate 3505. The heat dissipation device 3403 is incorporated into the metal interconnect 3507. The front side 3519 faces the interposer 3511.

Figure 36:
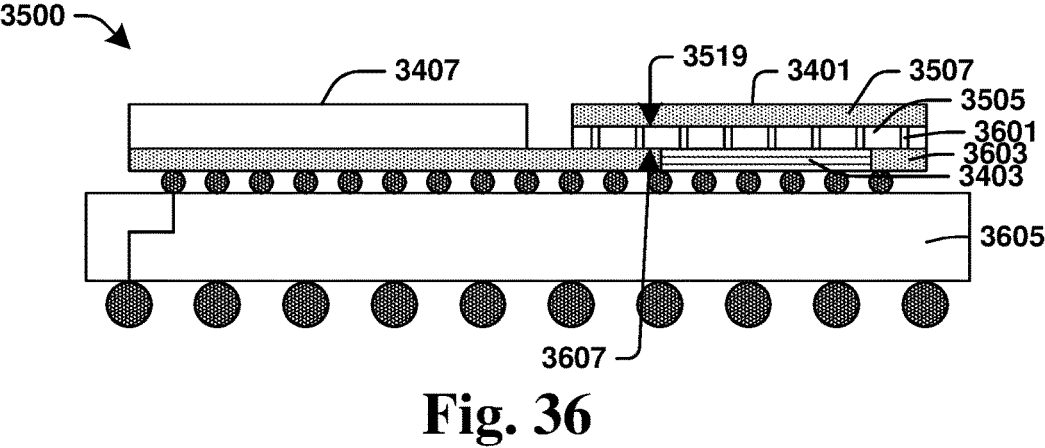
FIG. 36 is a cross-sectional view of an IC package in accordance with some other aspects of the present disclosure.

FIG. 36 provides a cross-sectional view illustration of another package 3600 having the layout of SoC 3400. The cross-section is taken through the line A-A' of FIG. 34. The package 3500 is an integrated fan-out (InFO) package. In the package 3500, a redistribution layer (RDL) 3603 is on a back side 3607 of the substrate 3505. The logic chip 3407, the analog chip 3405, and the power management chip 3401 communicate with each other and are coupled to the package substrate 3605 through the RDL 3603. TSVs 3601 are formed through the substrate 3505 to couple the PMIC with the RDL 3603 and the heat dissipation device 3403 is incorporated into RDL 3603.

Figure 37:
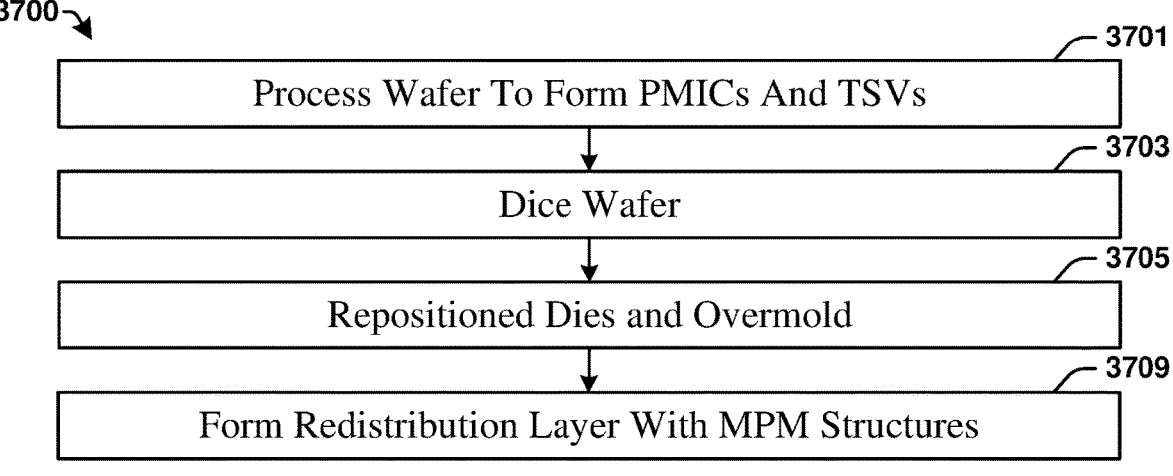
FIG. 37 is a method of forming an IC package in accordance with some aspects of the present disclosure.

FIG. 37 provides a flow chart for a method 3700 that may be used to form the package 3600. Act 3601 is processing a wafer to form PMICs and TSVs. Act 3703 is dicing the wafer. Act 3705 is repositioning the resulting dies and over-molding. Additional dies such as the logic chip 3407 and the analog chip 3405 may be introduced at this stage of processing. Act 3709 is forming the RDL layer. Formation of the heat dissipation device including the MPM structures is integrated into formation of the RDL layer.

Some aspects of the present disclosure relate to an IC device that includes a first semiconductor substrate on which is formed a first metal interconnect comprising a first metallization layer, a second metallization layer, and a third metallization layer. A first metal layer-pyroelectric layer-metal layer (MPM) stack is between the first metallization layer and the second metallization layer and a second MPM stack is between the second metallization layer and the third metallization layer. In some embodiments the first MPM stack and the second MPM stack are on a same side of the first semiconductor substrate as the PMIC. In some embodiments the first MPM stack and the second MPM stack are on opposite sides of the semiconductor substrate from the PMIC. In some embodiments the first MPM stack is directly over a first high voltage device of the PMIC and is laterally offset from a second high voltage device of the PMIC. In some embodiments the first metal interconnect is between the first second semiconductor substrate and a second semiconductor substrate. In some embodiments the first MPM comprises at least five layers including two pyroelectric layers and three metal layers. In some embodiments an electrode in the first MPM stack is coupled to an electrode in the second MPM stack through a wire in the second metallization layer. In some embodiments, an array of vias couples an electrode in the first MPM stack to a wire in the second metallization layer. In some embodiments, the vias land on a surface of the electrode that juts out from the first MPM stack. In some embodiments, the first metal interconnect is a redistribution layer in an InFO package. In some embodiments, a thickness of the MPM stack is less than half a distance between the first metallization layer and the second metallization layer.

Some aspects of the present disclosure relate to an IC device that includes a first semiconductor substrate, a power management integrated circuit on the first semiconductor substrate, a metal interconnect attached to the first semiconductor substrate, and heat dissipation device facing the power management integrated circuit. The heat dissipation device comprises a first pyroelectric layer disposed between a first pair of metallization layers within the metal interconnect. In some embodiments, the metal interconnect is on a front side of the semiconductor substrate. In some embodiments, a second semiconductor substrate is over the metal interconnect. In some embodiments, the metal interconnect is on a back side of the first semiconductor substrate. In some embodiments, the heat dissipation device comprises a second pyroelectric layer disposed between the two metallization layers and separated from the first pyroelectric layer by a metal layer. In some embodiments, a first metal layer abuts the first pyroelectric layer and a second metal layer abuts the second pyroelectric layer. In some embodiments, the first metal layer is between a first pair of metallization layers and the second metal layer is between a second pair of metallization layers. In some embodiments, the first metal layer and the second metal layer are coupled through two vias and a wire. In some embodiments, the first metal layer is coupled to a first wire, the second metal layer is coupled to a second wire, the first wire is in one of the first pair of metallization layers, and the second wire is in one of the second pair of metallization layers. In some embodiments, the heat dissipation device includes an MPM structure comprising at least five layers including the first pyroelectric layer and a second pyroelectric layer. In some embodiments, the MPM structure comprises two or more metal layers in a staircase pattern.

Some aspects of the present disclosure relate to a method of increasing heat dissipation in an IC device. The method includes applying a first electric field to a first pyroelectric layer so as to increase its temperature, applying a second electric field to a second pyroelectric layer so as to increase its temperature, relaxing the first electric field so as to decrease the temperature of the first pyroelectric layer, and relaxing the second electric field so as to decrease the temperature of the second pyroelectric layer. The first pyroelectric layer and the second pyroelectric are in distinct layers disposed over a semiconductor substrate. In some embodiments, the second pyroelectric layer is further from the semiconductor substrate than the first pyroelectric layer. In some embodiments the first pyroelectric layer is at a first level of a metal interconnect and the second pyroelectric layer is at a second level of the metal interconnect, which is further from the semiconductor substrate than the first level. The metal interconnect is over the semiconductor substrate. In some embodiments, the method includes maintaining an electrode between the first pyroelectric layer and the second pyroelectric layer at a ground potential. In some embodiments the method further includes applying a third electric field to a third pyroelectric structure so as to increase its temperature and relaxing the third electric field so as to decrease its temperature. The third pyroelectric structure is at a third level of the metal interconnect which is a greater distance from the semiconductor substrate than the second level.

Some aspects of the present disclosure relate to a method of fabricating an integrated circuit device, the method includes forming a first metallization layer, forming a first MPM structure over the first metallization layer, forming a second metallization layer over the first MPM structure, and forming a second MPM structure over the second metallization layer. The MPM structure may provide a heat dissipation device. In some embodiments, the MPM structures are formed directly over a PMIC. In some embodiments, the method includes forming MPM structures between each pair of metallization layers in the metal interconnect.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated circuit device, the method comprising:
forming a first metallization layer over a semiconductor substrate;
forming a first metal layer-pyroelectric layer-metal layer (MPM) structure by a first process including deposition on the semiconductor substrate over the first metallization layer;
forming a second metallization layer over the first MPM structure; and
forming a second MPM structure by a second process including deposition on the semiconductor substrate over the second metallization layer.

2. The method of claim 1, further comprising forming a power management integrated circuit on the semiconductor substrate, wherein the first MPM structure is disposed along a vertical axis over the power management integrated circuit.

3. The method of claim 1, wherein the method includes forming distinct MPM structures between each pair of metallization layers in a back-end-of-line metal interconnect structure comprising the first metallization layer and the second metallization layer.

4. The method of claim 1, wherein a top electrode of the first MPM structure is coupled to a bottom electrode of the second MPM structure.

5. A method of fabricating an integrated circuit device, the method comprising:
forming a first metallization layer over a semiconductor substrate;
forming a stack comprising two pyroelectric layers interleaved with three metal layers by successive deposition of a first metal layer, a first pyroelectric layer, a second metal layer, a second pyroelectric layer, and a third metal layer on the semiconductor substrate;
patterning the stack by forming a mask over the stack and selectively etching through the stack in regions not covered by the mask to define a heat dissipation device with three electrodes, each corresponding to one of the three metal layers;
forming conductive vias that contact the three electrodes, wherein the heat dissipation device is electrically operable through the conductive vias to dissipate heat via the electrocaloric effect; and
forming a second metallization layer over the heat dissipation device.

6. The method of claim 5, wherein a middle of the three electrodes is grounded.

7. The method of claim 5, wherein patterning the stack leaves a middle of the three electrodes jutting out from under an uppermost of the three electrodes.

8. The method of claim 7, wherein etching the stack leaves a lowermost of the three electrodes jutting out from under the middle of the three electrodes.

9. The method of claim 5, wherein each of the three electrodes is connected to a corresponding wire in the second metallization layer by a plurality of the vias.

10. A method of fabricating an integrated circuit device, the method comprising:
using front-end-of-line processing to form a power management integrated circuit on a front side of a first semiconductor substrate having a back side;

sequentially depositing a first metal layer, a first pyroelectric layer, and a second metal layer to form a first stack on the first semiconductor substrate having the power management integrated circuit;

forming a first mask and etching through the first mask to pattern the first stack to define a first metal layer-pyroelectric layer-metal layer structure;

sequentially depositing a third metal layer, a second pyroelectric layer, and a fourth metal layer to form a second stack on the first semiconductor substrate having the power management integrated circuit; and forming a second mask and etching through the second mask to pattern the second stack to define a second metal layer-pyroelectric layer-metal layer structure above the metal layer-pyroelectric layer-metal layer structure;

wherein the first metal layer-pyroelectric layer-metal layer structure and the second metal layer-pyroelectric layer-metal layer structure are operative to draw heat away from the power management integrated circuit via the electrocaloric effect.

11. The method of claim 10, wherein the first metal layer-pyroelectric layer-metal layer structure and the second metal layer-pyroelectric layer-metal layer structure form a first heat dissipation device, a second heat dissipation device of the same type is formed laterally to the first heat dissipation device in a single die area of the semiconductor substrate, and the method further comprises forming a via that extends from the second metallization layer to the first metallization layer between the first heat dissipation device and the second heat dissipation device.

12. The method of claim 10, wherein the first metal layer-pyroelectric layer-metal layer structure and the second metal layer-pyroelectric layer-metal layer structure are formed on the back side.

13. The method of claim 10, further comprising forming an array of vias that connect to the second metal layer-pyroelectric layer-metal layer structure.

14. The method of claim 13, wherein the first metal layer-pyroelectric layer-metal layer structure is between a first metallization layer and a second metallization layer in a back-end-of-line metal interconnect structure.

15. The method of claim 10, wherein the first metal layer-pyroelectric layer-metal layer structure and the second metal layer-pyroelectric layer-metal layer structure are positioned to drive heat transfer from the power management integrated circuit to a thermal through-substrate-via.

16. The method of claim 10, wherein the first metal layer-pyroelectric layer-metal layer structure and the second metal layer-pyroelectric layer-metal layer structure are positioned to drive heat transfer from the power management integrated circuit to a metal ground connection.

17. The method of claim 10, further comprising attaching a second semiconductor substrate to the first semiconductor substrate so that the first metal layer-pyroelectric layer-metal layer structure and the second metal layer-pyroelectric layer-metal layer structure are between the first semiconductor substrate and the second semiconductor substrate.

18. The method of claim 10, wherein forming the power management integrated circuit comprises forming a first high voltage device and a second high voltage device, wherein the first metal layer-pyroelectric layer-metal layer structure and the second metal layer-pyroelectric layer-metal layer structure are disposed over the first high voltage device along a vertical axis and are laterally offset from the power management integrated circuit.

19. The method of claim 10, further comprising forming a third metal layer-pyroelectric layer-metal layer structure over the second metal layer-pyroelectric layer-metal layer structure, wherein the third metal layer-pyroelectric layer-metal layer structure, is between the second metal layer-pyroelectric layer-metal layer structure and a heat sink.

20. The method of claim 10, further comprising forming a circuit operative to raise and lower voltages on the metal layers in the first metal layer-pyroelectric layer-metal layer structure and the second metal layer-pyroelectric layer-metal layer structure in a sequence that increases heat transfer from the power management integrated circuit.

* * * * *